(12) United States Patent
Bowen et al.

(10) Patent No.: US 11,110,683 B2
(45) Date of Patent: Sep. 7, 2021

(54) SUBSTRATES COMPRISING NANO-PATTERNING SURFACES AND METHODS OF PREPARING THEREOF

(71) Applicant: ILLUMINA, INC., San Diego, CA (US)

(72) Inventors: M. Shane Bowen, San Diego, CA (US); Bala Murali Venkatesan, San Diego, CA (US); Steven M. Barnard, San Diego, CA (US)

(73) Assignee: ILLUMINA, INC., San Diego, CA (US)

( * ) Notice: Subject to any disclaimer, the term of this patent is extended or adjusted under 35 U.S.C. 154(b) by 0 days.

(21) Appl. No.: 16/880,809

(22) Filed: May 21, 2020

(65) Prior Publication Data
US 2020/0282693 A1    Sep. 10, 2020

Related U.S. Application Data

(62) Division of application No. 15/025,866, filed as application No. PCT/US2014/070777 on Dec. 17, 2014, now Pat. No. 10,682,829.
(Continued)

(51) Int. Cl.
*B32B 3/26* (2006.01)
*B32B 3/30* (2006.01)
(Continued)

(52) U.S. Cl.
CPC ............... *B32B 3/266* (2013.01); *B32B 3/30* (2013.01); *C08G 69/00* (2013.01); *G03F 7/0002* (2013.01); *B29C 59/005* (2013.01); *B29C 59/022* (2013.01); *B29K 2077/00* (2013.01); *B29K 2105/0085* (2013.01); *B81B 2201/0214* (2013.01);
(Continued)

(58) Field of Classification Search
CPC .................................................. B32B 3/266
See application file for complete search history.

(56) References Cited

U.S. PATENT DOCUMENTS

| 5,077,210 A | 12/1991 | Ligler et al. |
| 5,429,807 A | 7/1995 | Matson et al. |

(Continued)

FOREIGN PATENT DOCUMENTS

| CN | 1550556 A | 12/2004 |
| CN | 101627337 A | 1/2010 |

(Continued)

OTHER PUBLICATIONS

Office Action for Australian Patent Application No. 2014364898 dated Oct. 16, 2017 by Australian Patent Office.
(Continued)

*Primary Examiner* — Larry W Thrower
(74) *Attorney, Agent, or Firm* — Knobbe, Martens, Olson & Bear, LLP

(57) ABSTRACT

Substrates comprising a functionalizable layer, a polymer layer comprising a plurality of micro-scale or nano-scale patterns, or combinations thereof, and a backing layer and the preparation thereof by using room-temperature UV nano-embossing processes are disclosed. The substrates can be prepared by a roll-to-roll continuous process. The substrates can be used as flow cells, nanofluidic or microfluidic devices for biological molecules analysis.

17 Claims, 19 Drawing Sheets

Related U.S. Application Data

(60) Provisional application No. 61/918,582, filed on Dec. 19, 2013.

(51) Int. Cl.
  *G03F 7/00* (2006.01)
  *C08G 69/00* (2006.01)
  *B29C 59/00* (2006.01)
  *B29C 59/02* (2006.01)
  *B29K 77/00* (2006.01)
  *B29K 105/00* (2006.01)

(52) U.S. Cl.
  CPC ....... *B81B 2201/05* (2013.01); *B81B 2203/03* (2013.01); *B81B 2203/0315* (2013.01); *B81B 2203/0323* (2013.01); *B81B 2203/0361* (2013.01)

(56) References Cited

U.S. PATENT DOCUMENTS

| | | |
|---|---|---|
| 5,436,327 A | 7/1995 | Southern et al. |
| 5,561,071 A | 10/1996 | Hollenberg et al. |
| 5,583,211 A | 12/1996 | Coassin et al. |
| 5,641,658 A | 6/1997 | Adams et al. |
| 5,658,734 A | 8/1997 | Brock et al. |
| 5,837,858 A | 11/1998 | Brennan |
| 5,874,219 A | 2/1999 | Rava et al. |
| 5,919,523 A | 7/1999 | Sundberg et al. |
| 6,136,269 A | 10/2000 | Winkler et al. |
| 6,287,768 B1 | 9/2001 | Chenchik et al. |
| 6,287,776 B1 | 9/2001 | Hefti |
| 6,288,220 B1 | 9/2001 | Kambara et al. |
| 6,291,193 B1 | 9/2001 | Khodadoust |
| 6,297,006 B1 | 10/2001 | Drmanac et al. |
| 6,346,413 B1 | 2/2002 | Fodor et al. |
| 6,355,431 B1 | 3/2002 | Chee et al. |
| 6,372,813 B1 | 4/2002 | Johnson et al. |
| 6,416,949 B1 | 7/2002 | Dower et al. |
| 6,465,178 B2 | 10/2002 | Chappa et al. |
| 6,482,591 B2 | 11/2002 | Lockhart et al. |
| 6,514,751 B2 | 2/2003 | Johann et al. |
| 6,524,793 B1 | 2/2003 | Chandler et al. |
| 6,610,482 B1 | 8/2003 | Fodor et al. |
| 6,682,942 B1 | 1/2004 | Wagner |
| 7,115,400 B1 | 10/2006 | Adessi et al. |
| 9,314,548 B2 | 4/2016 | Robeson et al. |
| 2002/0055100 A1 | 5/2002 | Kawashima et al. |
| 2002/0094533 A1 | 7/2002 | Hess |
| 2002/0102578 A1 | 8/2002 | Dickinson et al. |
| 2002/0145381 A1 | 10/2002 | Humbs |
| 2002/0146730 A1 | 10/2002 | Liu |
| 2002/0197568 A1 | 12/2002 | Neriishi |
| 2003/0059929 A1 | 3/2003 | Heller et al. |
| 2003/0180190 A1 | 9/2003 | Corcoran |
| 2003/0194532 A1 | 10/2003 | Schulz |
| 2004/0002090 A1 | 1/2004 | Mayer et al. |
| 2004/0096853 A1 | 5/2004 | Mayer |
| 2004/0126538 A1 | 7/2004 | Corcoran |
| 2004/0192041 A1 | 9/2004 | Jeong |
| 2004/0258885 A1 | 12/2004 | Kreutter |
| 2005/0046758 A1 | 3/2005 | Matsushita et al. |
| 2005/0121782 A1 | 6/2005 | Nakamura et al. |
| 2005/0164274 A1 | 7/2005 | Mecklenburg |
| 2006/0019263 A1 | 1/2006 | Quake |
| 2006/0021533 A1 | 2/2006 | Jeans |
| 2006/0115623 A1 | 6/2006 | Aizenberg |
| 2006/0207877 A1 | 9/2006 | Schmidt |
| 2006/0261481 A1 | 11/2006 | Nystrom |
| 2007/0037410 A1 | 2/2007 | Chang et al. |
| 2007/0077396 A1 | 4/2007 | Aizenberg |
| 2007/0128624 A1 | 6/2007 | Gormley et al. |
| 2007/0134128 A1 | 6/2007 | Korlach |
| 2008/0009420 A1 | 1/2008 | Schroth et al. |
| 2008/0095985 A1 | 4/2008 | Frey |
| 2008/0233280 A1 | 9/2008 | Blanchet |
| 2009/0011946 A1 | 1/2009 | Majumdar |
| 2009/0042736 A1 | 2/2009 | Bomer |
| 2009/0068759 A1 | 3/2009 | Arenas |
| 2009/0243584 A1 | 10/2009 | Zhang |
| 2009/0250588 A1 | 10/2009 | Robeson |
| 2009/0305513 A1 | 12/2009 | Kobrin |
| 2009/0311629 A1* | 12/2009 | Lee ................. B29C 33/424 430/320 |
| 2010/0053623 A1 | 3/2010 | Kwon |
| 2010/0096320 A1 | 4/2010 | Opperman |
| 2010/0098761 A1 | 4/2010 | Song |
| 2010/0111768 A1 | 5/2010 | Banerjee et al. |
| 2010/0111770 A1 | 5/2010 | Hwang |
| 2010/0190654 A1 | 7/2010 | Rothrock |
| 2010/0239647 A1 | 9/2010 | Byrne |
| 2010/0280561 A1 | 11/2010 | Song |
| 2011/0059865 A1 | 3/2011 | Smith et al. |
| 2011/0104732 A1 | 5/2011 | Lucic |
| 2012/0010636 A1 | 1/2012 | Boey |
| 2012/0095203 A1 | 4/2012 | Bernardin |
| 2012/0138461 A1 | 6/2012 | Sugiyama |
| 2012/0170032 A1 | 7/2012 | Zhu |
| 2012/0270305 A1 | 10/2012 | Reed et al. |
| 2012/0274004 A1 | 11/2012 | Kobrin |
| 2012/0316086 A1 | 12/2012 | Lin |
| 2013/0003070 A1 | 1/2013 | Sezaki |
| 2013/0022876 A1 | 1/2013 | Stokes |
| 2013/0040127 A1 | 2/2013 | Kim |
| 2013/0052456 A1 | 2/2013 | Opperman |
| 2013/0116153 A1 | 5/2013 | Bowen et al. |
| 2013/0154152 A1 | 6/2013 | Petrzelka |
| 2013/0204295 A1 | 8/2013 | Hunter |
| 2013/0270225 A1 | 10/2013 | Hampl |
| 2013/0337498 A1 | 12/2013 | Tokonami |
| 2013/0338042 A1 | 12/2013 | Shen et al. |
| 2014/0079923 A1 | 3/2014 | George et al. |
| 2014/0308476 A1 | 10/2014 | Manninen |
| 2015/0005447 A1 | 1/2015 | Berti et al. |
| 2015/0126393 A1 | 5/2015 | Corn |
| 2015/0160377 A1 | 6/2015 | Kuroda |
| 2016/0082502 A1 | 3/2016 | Appleby |

FOREIGN PATENT DOCUMENTS

| | | |
|---|---|---|
| EP | 0 742 287 A2 | 11/1996 |
| EP | 0 799 897 A1 | 10/1997 |
| EP | 1700680 | 9/2006 |
| EP | 1762893 | 11/2012 |
| JP | 2005-049101 | 2/2005 |
| JP | 2005-208044 | 8/2005 |
| JP | 2006-258585 | 9/2006 |
| JP | 2007-522433 | 8/2017 |
| JP | 2020-511544 | 4/2020 |
| WO | WO 93/17126 A1 | 9/1993 |
| WO | WO 95/11995 A1 | 5/1995 |
| WO | WO 95/35505 A1 | 12/1995 |
| WO | WO 00/31148 A2 | 6/2000 |
| WO | WO 00/53812 A2 | 9/2000 |
| WO | WO 00/63437 A2 | 10/2000 |
| WO | WO 01/01143 A2 | 1/2001 |
| WO | WO 2001/062982 A2 | 8/2001 |
| WO | WO 02/12566 A2 | 2/2002 |
| WO | WO 03/014392 A2 | 2/2003 |
| WO | WO 2004/086471 | 10/2004 |
| WO | WO 2005/030822 A2 | 4/2005 |
| WO | WO 2008/143650 | 11/2008 |
| WO | WO 2012/077324 | 6/2012 |
| WO | WO 2013/063382 | 5/2013 |
| WO | WO 2013/184796 | 12/2013 |

OTHER PUBLICATIONS

International Search Report and Written Opinion for Application No. PCT/US2014/070777, dated Mar. 23, 2016.
Xia, Younan, et al., Soft Lithography, Angew. Chem. Int. Ed., 1998, 37: 550-575.

(56) References Cited

OTHER PUBLICATIONS

Efimov et al. "Synthesis of polyacrylaminds N-substituted with PNA-like oligonucleotide mimics for molecular diagnostic applications", *Nucleic Acids Research*, 27(22):4416-4426, 1999.

\* cited by examiner

SUBSTRATES COMPRISING NANO-PATTERNING SURFACES AND METHODS OF PREPARING THEREOF

CROSS-REFERENCE TO RELATED APPLICATIONS

The present application is a division of U.S. application Ser. No. 15/025,866, filed Mar. 29, 2016, which is a U.S. national phase under 35 U.S.C. 371 of International Application No. PCT/US2014/070777, filed Dec. 17, 2014, which claims the benefit of priority to U.S. Provisional Appl. No. 61/918,582, filed Dec. 19, 2013, each of which is hereby incorporated by reference in its entirety.

FIELD

In general, the present application relates to the fields of nano-patterning process and substrates comprising nano-patterning surfaces. More specifically, the present application relates to substrates comprising at least two and in some embodiments at least three layers, including a polymer layer comprising nano-scale and micro-scale patterns. Methods of preparing these substrates by using a resist-free, room temperatures UV curing and embossing processes are also disclosed.

BACKGROUND

Nano-imprinting technology enables the economic and effective production of nanostructures. Standard nano-embossing lithography relies on direct mechanical deformation of the resist materials by a stamp having nanostructures, followed by an etching process to transfer the nanostructures from the stamp to the substrate.

SUMMARY

The current application utilizes a UV sensitive polymer to form a polymer layer with a plurality of micro-scale or nano-scale patterns. The UV release process prevents the stiction of the polymer to the template and prevents any deformation of the patterns during separation, hence giving robust pattern transfer even at nano-scale. The process of the present application is complementary to the thermal embossing process and does not require heating the master template and thereby avoids issues related to thermal stresses in materials and thermal gradients across the template.

The processes of the present application can be applied to technologies where low-cost micro and nano-patterning may be necessary. Applications include nano-manufacturing, medical diagnostics and global health, flexible display technology, nanofluidics, as well as emerging markets including the construction and automotive industries where low-cost methods to generate nano-patterned, super hydrophobic surfaces (dewetting windows, windscreens etc.) are gaining traction. The processes of the present application can also be applied to generate low-cost patterned consumables, for example, patterned plastic flowcells and low-cost microfluidic devices for use in sequencing devices.

With the spiraling cost of healthcare and the lack of medical infrastructure in developing nations, there is an increasing demand for point-of-care (POC) diagnostics and low cost Lab-on-a-Chip (LOC) technologies. Broadened applicability of these technologies can follow if they are made more cheap, robust, portable, disposable and most importantly, provide rapid time to result. To enable such advances, low cost patterning and microfluidic technologies are desired. Paper-based microfluidics have emerged as one potential candidate, but are difficult to fabricate using conventional lithography based approaches, are difficult to multiplex for the detection of multiple analytes, and readily wick solutions thereby requiring pre-concentration of the target analytes in many embodiments. The processes of the present application provide a highly cost-effective alternative to fabricating microfluidic based total analysis platforms for global health applications.

Some embodiments disclosed herein include a substrate comprising a functionalizable layer comprising one or more functional groups; a polymer layer comprising a plurality of micro-scale or nano-scale patterns, or combinations thereof; and a backing layer.

In some embodiments, the functionalizable layer is disposed between the backing layer and the polymer layer. In some embodiments, the polymer layer is disposed between the backing layer and the functionalizable layer. In some embodiments, the substrate can further comprise a sealing layer to substantially seal the polymer layer and the functionalizable layer between the backing layer and the sealing layer. In some such embodiments, the sealing layer is optically transparent.

In some embodiments, at least one of the micro-scale or nano-scale patterns is capable of admitting a sample fluid. In some embodiments, the substrate can further comprise a fluid reservoir, for example, a sample reservoir.

In any of the disclosed embodiments, the functionalizable layer can comprise a reactive silane layer, a functionalizable hydrogel or a functionalizable polymer. In some such embodiments, the functionalizable layer can comprise one or more functional groups. In some such embodiments, the functional group can be selected from the group consisting of optionally substituted alkene, azide, optionally substituted amine, carboxylic acid, optionally substituted hydrazone, halogen, hydroxy, optionally substituted tetrazole, optionally substituted tetrazine, thiol, and combinations thereof.

In any of the disclosed embodiments, the functional groups of the functionalizable layer can be attached to biomolecules. In some embodiments, the biomolecules are selected from amino acids, nucleosides, nucleotides, peptides, oligonucleotides, polynucleotides, nucleic acids, proteins, or combinations thereof. In some such embodiments, the biomolecules are polynucleotides or nucleic acids.

In any of the disclosed embodiments, the polymer layer comprises at least one photocurable polymer. In some embodiments, the photocurable polymer comprises a urethane, acrylate, silicone, epoxy, polyacrylic acid, polyacrylates, epoxysilicone, epoxy resins, polydimethylsiloxane (PDMS), silsesquioxane, acyloxysilanes, maleate polyesters, vinyl ethers, monomers with vinyl or ethynyl groups, or copolymers and combinations thereof.

Some embodiments disclosed herein include a process for preparing a substrate, comprising: providing a substrate comprising a functionalizable layer comprising one or more functional groups disposed between a backing layer and a layer of photocurable polymer; contacting a surface of the layer of photocurable polymer with a template having a plurality of micro-scale or nano-scale patterns including micro-scale or nano-scale wells, posts, or combinations thereof; applying pressure to the template or substrate to transfer the micro-scale or nano-scale patterns to at least the layer of photocurable polymer, where the contacting and applying are performed at room temperature; irradiating the photocurable polymer with UV light to cure the photocurable polymer; and separating the template from substrate; where at least a portion of the polymer layer is perforated to expose the underlying functionalizable layer. In some embodiments, at least a portion of polymer layer and functionalizable layer are perforated to expose the underlying backing layer.

Some embodiments disclosed herein include a process of preparing a substrate, comprising: providing a template comprising a plurality of micro-scale or nano-scale patterns including micro-scale or nano-scale wells, channels or combinations thereof on a surface of the template; depositing a functional layer comprising one or more functional groups on the surface of the template such that at least a portion of the micro-scale or nano-scale wells, channels or combinations thereof contain the functional layer; removing excess functionalizable layer from the surface of the template such that the functionalizable layer is present on only a portion of the template surface; providing a substrate comprising a backing layer having a photocurable polymer layer disposed on the backing layer; contacting a surface of the photocurable polymer layer with the surface of the template having the plurality of micro-scale or nano-scale patterns and functionalizable layer thereon; applying pressure to the template or substrate to transfer the micro-scale or nano-scale patterns to at least the layer of photocurable polymer, where the contacting and applying are performed at room temperature; irradiating the photocurable polymer with UV light to cure the photocurable polymer; and separating the template from the substrate; where at least a portion of the functionalizable layer is transferred to the polymer layer. In some embodiments, at least a portion of polymer layer is perforated to expose the backing layer. In some embodiments, the substrate further comprises a backing layer having a photocurable polymer layer disposed on the backing layer is a roll of flexible dicing tape.

In any of the disclosed process embodiments, the process can further comprises applying a sealing layer to the substrate after removing the template to substantially seal the polymer layer and the functionalizable layer between the backing layer and the sealing layer. In some embodiments, the sealing layer further comprises a second substrate prepared by the process of any of the disclosed embodiments, where the functionalizable layers and photocurable polymer layers of the substrates are disposed between the backing layers of the substrates. In some embodiments, the sealing layer is optically transparent. In some process embodiments, the process can be a roll to roll process.

DETAILED DESCRIPTION OF THE PREFERRED EMBODIMENTS

Figure 1A:
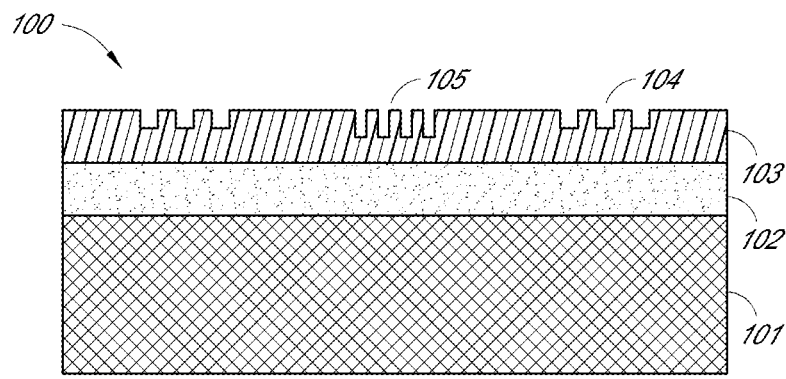
FIGS. 1A-1C are cross-section views of several embodiments of a substrate where a functionalizable layer is disposed between a polymer layer and a backing layer.

The following detailed description is directed to certain specific embodiments of the present application. In this description, reference is made to the drawings wherein like parts or steps may be designated with like numerals throughout for clarity. Reference in this specification to "one embodiment," "an embodiment," or "in some embodiments" means that a particular feature, structure, or characteristic described in connection with the embodiment can be included in at least one embodiment of the invention. The appearances of the phrases "one embodiment," "an embodiment," or "in some embodiments" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not other embodiments.

The section headings used herein are for organizational purposes only and are not to be construed as limiting the subject matter described.

Definitions

Unless defined otherwise, all technical and scientific terms used herein have the same meaning as is commonly understood by one of ordinary skill in the art. All patents, applications, published applications and other publications referenced herein are incorporated by reference in their entirety unless stated otherwise. As used in the specification and the appended claims, the singular forms "a," "an" and "the" include plural referents unless the context clearly dictates otherwise. The use of "or" means "and/or" unless stated otherwise. Furthermore, use of the term "including" as well as other forms, such as "include", "includes," and "included," is not limiting. As used in this specification, whether in a transitional phrase or in the body of the claim, the terms "comprise(s)" and "comprising" are to be interpreted as having an open-ended meaning. That is, the terms are to be interpreted synonymously with the phrases "having at least" or "including at least." When used in the context of a process, the term "comprising" means that the process includes at least the recited steps, but may include additional steps. When used in the context of a compound, composition, or device, the term "comprising" means that the compound, composition, or device includes at least the recited features or components, but may also include additional features or components.

As used herein, common organic abbreviations are defined as follows:

| | |
|---|---|
| PAZAM | poly(N-(5-azidoacetamidylpentyl) acrylamide-co-acrylamide) of any acrylamide to Azapa (N-(5-(2-azidoacetamido)pentyl)acrylamide) ratio |
| SEM | scanning electron microscope |
| ° C. | Temperature in degrees Centigrade |
| μm | micrometer |

As used herein, the term "array" refers to a population of different probe molecules that are attached to one or more substrates such that the different probe molecules can be spatially differentiated from each other. An array can include different probe molecules that are each located at a different addressable location on a substrate. Alternatively or additionally, an array can include separate substrates each bearing a different probe molecule, wherein the different probe molecules can be identified according to the locations of the substrates on a surface to which the substrates are attached or according to the locations of the substrates in a liquid. Exemplary arrays in which separate substrates are located on a surface include, without limitation, those including beads in wells as described, for example, in U.S. Pat. No. 6,355, 431 B1, US 2002/0102578 and PCT Publication No. WO 00/63437. Exemplary formats that can be used in the present application to distinguish beads in a liquid array, for example, using a microfluidic device, such as a fluorescent activated cell sorter (FACS), are described, for example, in U.S. Pat. No. 6,524,793. Further examples of arrays that can be used in the application include, without limitation, those described in U.S. Pat. Nos. 5,429,807; 5,436,327; 5,561, 071; 5,583,211; 5,658,734; 5,837,858; 5,874,219; 5,919, 523; 6,136,269; 6,287,768; 6,287,776; 6,288,220; 6,297, 006; 6,291,193; 6,346,413; 6,416,949; 6,482,591; 6,514,751 and 6,610,482; and WO 93/17126; WO 95/11995; WO 95/35505; EP 742 287; and EP 799 897.

As used herein, the term "covalently attached" or "covalently bonded" refers to the forming of a chemical bonding that is characterized by the sharing of pairs of electrons between atoms. For example, a "covalently attached polymer coating," when used in reference to a substrate surface, refers to a polymer coating that forms chemical bonds with a functionalized surface of a substrate, as compared to attachment to the surface via other means, for example, adhesion or electrostatic interaction. It will be appreciated that polymers that are attached covalently to a surface can also be bonded via other means in addition to covalent attachment.

As used herein, a "dicing tape" refers to a flexible substrate that includes a backing layer and an adhesive layer. The adhesive layer can be treated, for example, by thermal or photophysical treatment (e.g. UV light) to inhibit or destroy adhesive characteristics. Dicing tape can be made of PVC, polyolefin, or polyethylene backing material with an adhesive to hold the dies in place. A dicing tape can be in a variety of thicknesses, for example, from 75 to 150 μm, with a variety of adhesive strengths. UV tapes are dicing tapes in which the adhesive bond is broken by exposure to UV light after dicing.

As used herein, "functionalizable" layer refers to a layer or coating comprising reactive moieties that can be used to attach one or more biomolecules by way of a chemical reaction or molecular interaction. Such attachment may be via a covalent bond or through other bonding or interactive forces. In some embodiments the molecular interaction can be specific binding between a ligand and receptor, pairs of which include, but are not limited to, streptavidin and biotin, a nucleic acid and its complement, an antibody and ligand, and others known in the art. For example, a functionalizable layer can be a hydrogel comprising one or more functional groups that are capable of reacting with or binding to a biomolecule of interest. A non-limiting specific example is PAZAM comprising one or more azide functional groups, which can react with oligonucleotides comprising alkyne groups. In some instances, a functionalizable layer becomes a functionalized layer by reacting with biomolecules of interests with reactive site left.

As used herein, the term "photocurable polymer" refers to a polymer that is capable of undergoing a polymerization reaction when exposed to actinic radiation (such as UV radiation).

As used herein, the term "roll to roll process" refers to manipulation of an elongated substrate as it is transferred from one spool to another. An exemplary roll to roll process is continuous patterning of a surface with micro-scale or nano-scale patterns as the surface moves past a patterning device while being unspooled from one roll and spooled onto another roll.

As used herein, "alkyl" refers to a straight or branched hydrocarbon chain that is fully saturated (i.e., contains no double or triple bonds). The alkyl group may have 1 to 20 carbon atoms (whenever it appears herein, a numerical range such as "1 to 20" refers to each integer in the given range; e.g., "1 to 20 carbon atoms" means that the alkyl group may consist of 1 carbon atom, 2 carbon atoms, 3 carbon atoms, etc., up to and including 20 carbon atoms, although the present definition also covers the occurrence of the term "alkyl" where no numerical range is designated). The alkyl group may also be a medium size alkyl having 1 to 9 carbon atoms. The alkyl group could also be a lower alkyl having 1 to 4 carbon atoms. The alkyl group may be designated as "C$_{1-4}$ alkyl" or similar designations. By way of example only, "C$_{1-4}$ alkyl" indicates that there are one to four carbon atoms in the alkyl chain, i.e., the alkyl chain is selected from the group consisting of methyl, ethyl, propyl, iso-propyl, n-butyl, isobutyl, sec-butyl, and t-butyl. Typical alkyl groups include, but are in no way limited to, methyl, ethyl, propyl, isopropyl, butyl, isobutyl, tertiary butyl, pentyl, hexyl, and the like.

As used herein, "alkene" or "alkenyl" refers to a straight or branched hydrocarbon chain containing one or more double bonds. The alkenyl group may have 2 to 20 carbon atoms, although the present definition also covers the occurrence of the term "alkenyl" where no numerical range is designated. The alkenyl group may also be a medium size alkenyl having 2 to 9 carbon atoms. The alkenyl group could also be a lower alkenyl having 2 to 4 carbon atoms. The alkenyl group may be designated as "C$_{2-4}$ alkenyl" or similar designations. By way of example only, "C$_{2-4}$ alkenyl" indicates that there are two to four carbon atoms in the alkenyl chain, i.e., the alkenyl chain is selected from the group consisting of ethenyl, propen-1-yl, propen-2-yl, propen-3-yl, buten-1-yl, buten-2-yl, buten-3-yl, buten-4-yl, 1-methyl-propen-1-yl, 2-methyl-propen-1-yl, 1-ethyl-ethen-1-yl, 2-methyl-propen-3-yl, buta-1,3-dienyl, buta-1,2,-dienyl, and buta-1,2-dien-4-yl. Typical alkenyl groups include, but are in no way limited to, ethenyl, propenyl, butenyl, pentenyl, and hexenyl, and the like.

As used herein, "alkynyl" refers to a straight or branched hydrocarbon chain containing one or more triple bonds. The alkynyl group may have 2 to 20 carbon atoms, although the present definition also covers the occurrence of the term "alkynyl" where no numerical range is designated. The alkynyl group may also be a medium size alkynyl having 2 to 9 carbon atoms. The alkynyl group could also be a lower alkynyl having 2 to 4 carbon atoms. The alkynyl group may be designated as "C$_{2-4}$ alkynyl" or similar designations. By way of example only, "C$_{2-4}$ alkynyl" indicates that there are two to four carbon atoms in the alkynyl chain, i.e., the alkynyl chain is selected from the group consisting of ethynyl, propyn-1-yl, propyn-2-yl, butyn-1-yl, butyn-3-yl, butyn-4-yl, and 2-butynyl. Typical alkynyl groups include, but are in no way limited to, ethynyl, propynyl, butynyl, pentynyl, and hexynyl, and the like.

An "amino" group refers to a "—NR$_A$R$_B$" group in which R$_A$ and R$_B$ are each independently selected from hydrogen, C$_{1-6}$ alkyl, C$_{2-6}$ alkenyl, C$_{2-6}$ alkynyl, C$_{3-7}$ carbocyclyl, C$_{6-10}$ aryl, 5-10 membered heteroaryl, and 5-10 membered heterocyclyl, as defined herein. A non-limiting example includes free amino (i.e., —NH$_2$).

As used herein, "aryl" refers to an aromatic ring or ring system (i.e., two or more fused rings that share two adjacent carbon atoms) containing only carbon in the ring backbone. When the aryl is a ring system, every ring in the system is aromatic. The aryl group may have 6 to 18 carbon atoms, although the present definition also covers the occurrence of the term "aryl" where no numerical range is designated. In some embodiments, the aryl group has 6 to 10 carbon atoms. The aryl group may be designated as "C$_{6-10}$ aryl," "C$_6$ or C$_{10}$ aryl," or similar designations. Examples of aryl groups include, but are not limited to, phenyl, naphthyl, azulenyl, and anthracenyl.

As used herein, the term "carboxylic acid" as used herein refers to —C(O)OH.

As used herein, "carbocyclyl" means a non-aromatic cyclic ring or ring system containing only carbon atoms in the ring system backbone. When the carbocyclyl is a ring system, two or more rings may be joined together in a fused, bridged or spiro-connected fashion. Carbocyclyls may have any degree of saturation provided that at least one ring in a ring system is not aromatic. Thus, carbocyclyls include cycloalkyls, cycloalkenyls, and cycloalkynyls. The carbocyclyl group may have 3 to 20 carbon atoms, although the present definition also covers the occurrence of the term "carbocyclyl" where no numerical range is designated. The carbocyclyl group may also be a medium size carbocyclyl having 3 to 10 carbon atoms. The carbocyclyl group could also be a carbocyclyl having 3 to 6 carbon atoms. The carbocyclyl group may be designated as "C$_{3-6}$ carbocyclyl" or similar designations. Examples of carbocyclyl rings include, but are not limited to, cyclopropyl, cyclobutyl, cyclopentyl, cyclohexyl, cyclohexenyl, 2,3-dihydro-indene, bicycle[2.2.2]octanyl, adamantyl, and spiro[4.4]nonanyl.

As used herein, the term "hydrazone" or "hydrazonyl" as used herein refers to a

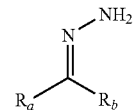

group in which R$_a$ and R$_b$ are each independently selected from hydrogen, C$_{1-6}$ alkyl, C$_{2-6}$ alkenyl, C$_{2-6}$ alkynyl, C$_{3-7}$ carbocyclyl, C$_{6-10}$ aryl, 5-10 membered heteroaryl, and 5-10 membered heterocyclyl, as defined herein. A non-limiting example includes free amino (i.e., —NH$_2$).

The term "halogen" or "halo," as used herein, means any one of the radio-stable atoms of column 7 of the Periodic Table of the Elements, e.g., fluorine, chlorine, bromine, or iodine, with fluorine and chlorine being preferred.

As used herein, "heteroaryl" refers to an aromatic ring or ring system (i.e., two or more fused rings that share two adjacent atoms) that contain(s) one or more heteroatoms, that is, an element other than carbon, including but not limited to, nitrogen, oxygen and sulfur, in the ring backbone. When the heteroaryl is a ring system, every ring in the system is aromatic. The heteroaryl group may have 5-18 ring members (i.e., the number of atoms making up the ring backbone, including carbon atoms and heteroatoms), although the present definition also covers the occurrence of the term "heteroaryl" where no numerical range is designated. In some embodiments, the heteroaryl group has 5 to 10 ring members or 5 to 7 ring members. The heteroaryl group may be designated as "5-7 membered heteroaryl," "5-10 membered heteroaryl," or similar designations. Examples of heteroaryl rings include, but are not limited to, furyl, thienyl, phthalazinyl, pyrrolyl, oxazolyl, thiazolyl, imidazolyl, pyrazolyl, isoxazolyl, isothiazolyl, triazolyl, thiadiazolyl, pyridinyl, pyridazinyl, pyrimidinyl, pyrazinyl, triazinyl, quinolinyl, isoquinlinyl, benzimidazolyl, benzoxazolyl, benzothiazolyl, indolyl, isoindolyl, and benzothienyl.

As used herein, "heterocyclyl" means a non-aromatic cyclic ring or ring system containing at least one heteroatom in the ring backbone. Heterocyclyls may be joined together in a fused, bridged or spiro-connected fashion. Heterocyclyls may have any degree of saturation provided that at least one ring in the ring system is not aromatic. The heteroatom(s) may be present in either a non-aromatic or aromatic ring in the ring system. The heterocyclyl group may have 3 to 20 ring members (i.e., the number of atoms making up the ring backbone, including carbon atoms and heteroatoms), although the present definition also covers the occurrence of the term "heterocyclyl" where no numerical range is designated. The heterocyclyl group may also be a medium size heterocyclyl having 3 to 10 ring members. The heterocyclyl group could also be a heterocyclyl having 3 to 6 ring members. The heterocyclyl group may be designated as "3-6 membered heterocyclyl" or similar designations. In preferred six membered monocyclic heterocyclyls, the heteroatom(s) are selected from one up to three of O, N or S, and in preferred five membered monocyclic heterocyclyls, the heteroatom(s) are selected from one or two heteroatoms selected from O, N, or S. Examples of heterocyclyl rings include, but are not limited to, azepinyl, acridinyl, carbazolyl, cinnolinyl, dioxolanyl, imidazolinyl, imidazolidinyl, morpholinyl, oxiranyl, oxepanyl, thiepanyl, piperidinyl, piperazinyl, dioxopiperazinyl, pyrrolidinyl, pyrrolidonyl, pyrrolidionyl, 4-piperidonyl, pyrazolinyl, pyrazolidinyl, 1,3-dioxinyl, 1,3-dioxanyl, 1,4-dioxinyl, 1,4-dioxanyl, 1,3-oxathianyl, 1,4-oxathiinyl, 1,4-oxathianyl, 2H-1,2-oxazinyl, trioxanyl, hexahydro-1,3,5-triazinyl, 1,3-dioxolyl, 1,3-dioxolanyl, 1,3-dithiolyl, 1,3-dithiolanyl, isoxazolinyl, isoxazolidinyl, oxazolinyl, oxazolidinyl, oxazolidinonyl, thiazolinyl, thiazolidinyl, 1,3-oxathiolanyl, indolinyl, isoindolinyl, tetrahydrofuranyl, tetrahydropyranyl, tetrahydrothiophenyl, tetrahydrothiopyranyl, tetrahydro-1,4-thiazinyl, thiamorpholinyl, dihydrobenzofuranyl, benzimidazolidinyl, and tetrahydroquinoline.

As used herein, the term "tetrazine" or "tetrazinyl" refers to six-membered heteroaryl group comprising four nitrogen atoms. Tetrazine can be optionally substituted.

As used herein, the term "tetrazole" or "tetrazolyl" refers to five membered heterocyclic group comprising four nitrogen atoms. Tetrazole can be optionally substituted.

As used herein, a "nucleotide" includes a nitrogen containing heterocyclic base, a sugar, and one or more phosphate groups. They are monomeric units of a nucleic acid sequence. In RNA, the sugar is a ribose, and in DNA a deoxyribose, i.e. a sugar lacking a hydroxyl group that is present at the 2' position in ribose. The nitrogen containing heterocyclic base can be purine or pyrimidine base. Purine bases include adenine (A) and guanine (G), and modified derivatives or analogs thereof. Pyrimidine bases include cytosine (C), thymine (T), and uracil (U), and modified derivatives or analogs thereof. The C-1 atom of deoxyribose is bonded to N-1 of a pyrimidine or N-9 of a purine.

As used herein, a "nucleoside" is structurally similar to a nucleotide, but lacks any phosphate moieties at the 5' position. The term "nucleoside" is used herein in its ordinary sense as understood by those skilled in the art. Examples include, but are not limited to, a ribonucleoside comprising a ribose moiety and a deoxyribonucleoside comprising a deoxyribose moiety. A modified pentose moiety is a pentose moiety in which an oxygen atom has been replaced with a carbon and/or a carbon has been replaced with a sulfur or an oxygen atom. A "nucleoside" is a monomer that can have a substituted base and/or sugar moiety. Additionally, a nucleoside can be incorporated into larger DNA and/or RNA polymers and oligomers.

As used herein, the term "polynucleotide" refers to nucleic acids in general, including DNA (e.g. genomic DNA cDNA), RNA (e.g. mRNA), synthetic oligonucleotides and synthetic nucleic acid analogs. Polynucleotides may include natural or non-natural bases, or combinations thereof and natural or non-natural backbone linkages, e.g. phosphorothioates, PNA or 2'-O-methyl-RNA, or combinations thereof.

As used herein, a substituted group is derived from the unsubstituted parent group in which there has been an exchange of one or more hydrogen atoms for another atom or group. Unless otherwise indicated, when a group is deemed to be "substituted," it is meant that the group is substituted with one or more substituents independently selected from $C_1$-$C_6$ alkyl, $C_1$-$C_6$ alkenyl, $C_1$-$C_6$ alkynyl, $C_1$-$C_6$ heteroalkyl, $C_3$-$C_7$ carbocyclyl (optionally substituted with halo, $C_1$-$C_6$ alkyl, $C_1$-$C_6$ alkoxy, $C_1$-$C_6$ haloalkyl, and $C_1$-$C_6$ haloalkoxy), $C_3$-$C_7$-carbocyclyl-$C_1$-$C_6$-alkyl (optionally substituted with halo, $C_1$-$C_6$ alkyl, $C_1$-$C_6$ alkoxy, $C_1$-$C_6$ haloalkyl, and $C_1$-$C_6$ haloalkoxy), 5-10 membered heterocyclyl (optionally substituted with halo, $C_1$-$C_6$ alkyl, $C_1$-$C_6$ alkoxy, $C_1$-$C_6$ haloalkyl, and $C_1$-$C_6$ haloalkoxy), 5-10 membered heterocyclyl-$C_1$-$C_6$-alkyl (optionally substituted with halo, $C_1$-$C_6$ alkyl, $C_1$-$C_6$ alkoxy, $C_1$-$C_6$ haloalkyl, and $C_1$-$C_6$ haloalkoxy), aryl (optionally substituted with halo, $C_1$-$C_6$ alkyl, $C_1$-$C_6$ alkoxy, $C_1$-$C_6$ haloalkyl, and $C_1$-$C_6$ haloalkoxy), aryl($C_1$-$C_6$)alkyl (optionally substituted with halo, $C_1$-$C_6$ alkyl, $C_1$-$C_6$ alkoxy, $C_1$-$C_6$ haloalkyl, and $C_1$-$C_6$ haloalkoxy), 5-10 membered heteroaryl (optionally substituted with halo, $C_1$-$C_6$ alkyl, $C_1$-$C_6$ alkoxy, $C_1$-$C_6$ haloalkyl, and $C_1$-$C_6$ haloalkoxy), 5-10 membered heteroaryl($C_1$-$C_6$)alkyl (optionally substituted with halo, $C_1$-$C_6$ alkyl, $C_1$-$C_6$ alkoxy, $C_1$-$C_6$ haloalkyl, and $C_1$-$C_6$ haloalkoxy), halo, cyano, hydroxy, $C_1$-$C_6$ alkoxy, $C_1$-$C_6$ alkoxy($C_1$-$C_6$)alkyl (i.e., ether), aryloxy, sulfhydryl (mercapto), halo($C_1$-$C_6$) alkyl (e.g., —$CF_3$), halo($C_1$-$C_6$)alkoxy (e.g., —$OCF_3$), $C_1$-$C_6$ alkylthio, arylthio, amino, amino($C_1$-$C_6$)alkyl, nitro, O-carbamyl, N-carbamyl, O-thiocarbamyl, N-thiocarbamyl, C-amido, N-amido, S-sulfonamido, N-sulfonamido, C-carboxy, O-carboxy, acyl, cyanato, isocyanato, thiocyanato, isothiocyanato, sulfinyl, sulfonyl, and oxo (=O). Wherever a group is described as "optionally substituted" that group can be substituted with the above substituents.

Some embodiments disclosed herein include a substrate comprising a functionalizable layer comprising one or more functional groups; a polymer layer comprising a plurality of micro-scale or nano-scale patterns, or combinations thereof; and a backing layer.

In some embodiments, the functionalizable layer is disposed between the backing layer and the polymer layer. In some such embodiments, at least a portion of the micro-scale or nano-scale patterns of the polymer layer perforate the polymer layer to expose the underlying functionalizable layer. In some such embodiments, the functionalizable layer comprises a plurality of micro-scale or nano-scale patterns, or combinations thereof, and at least a portion of the micro-scale or nano-scale patterns of the polymer and functionalizable layers perforate the polymer and functionalizable layers to expose the underlying backing layer.

Figure 1B:
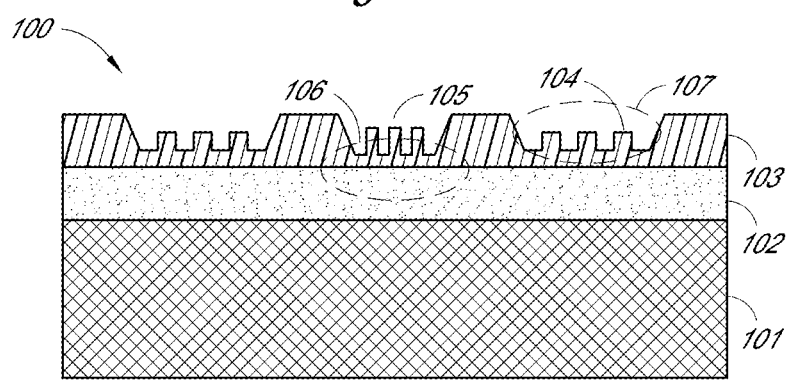
Figure 1C:
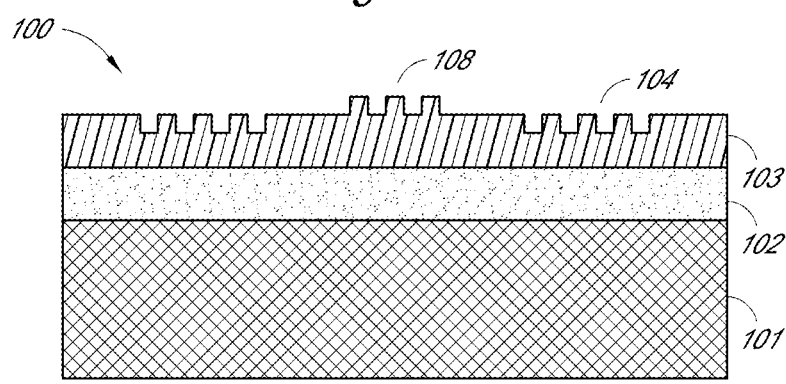

FIGS. 1A-1C illustrate the cross-section views of a substrate 100 according to some embodiments of the present invention comprising a functionalizable layer 102 comprising one or more functional groups; a polymer layer 103 comprising a plurality of micro-scale or nano-scale patterns, or combinations thereof; and a backing layer 101, where the functionalizable layer 102 is disposed between the backing layer 101 and the polymer layer 103. As shown in FIG. 1A, a substrate 100 comprises at least three layers, a backing layer 101, a functionalizable layer 102 and a polymer layer 103. The polymer layer 103 comprises a plurality of nano-scale patterns 104 and 105 in different shape and depth. In some other embodiments, the nano-scale patterns of the polymer layer can be the same.

In some embodiments, the polymer layer has a combination of both micro-scale and nano-scale patterns. As shown in FIG. 1B, the polymer layer 103 further comprises a plurality of micro-scale patterns 106 and 107, where the nano-scale patterns 104 and 105 are formed within the micro-scale patterns. As shown in FIG. 1C, the nano-scale structures can be both nano-wells 104 and nano-posts 108. In FIGS. 1A-1C, the underlying functionalizable layer 102 is not exposed.

Figure 2A:
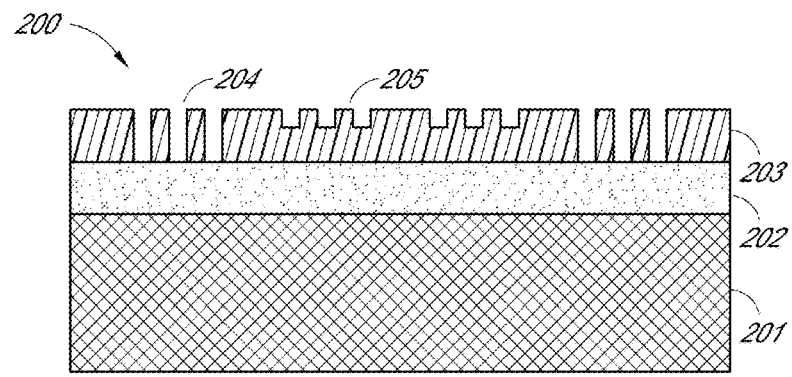
FIGS. 2A-2C are cross-section views of several embodiments of a substrate where a functionalizable layer is disposed between a polymer layer and a backing layer.

In some embodiments, at least a portion of the micro-scale or nano-scale patterns of the polymer layer perforate the polymer layer to expose the underlying functionalizable layer. FIG. 2A illustrate the cross-section view of a substrate 200 according to an embodiment of the present invention having the same layer configuration as those described in FIGS. 1A-1C, where the polymer layer 203 comprises nano-scale patterns 204 and 205. Nano-scale patterns 204 perforate the polymer layer 203 to expose the underlying functionalizable layer 202.

Figure 2B:
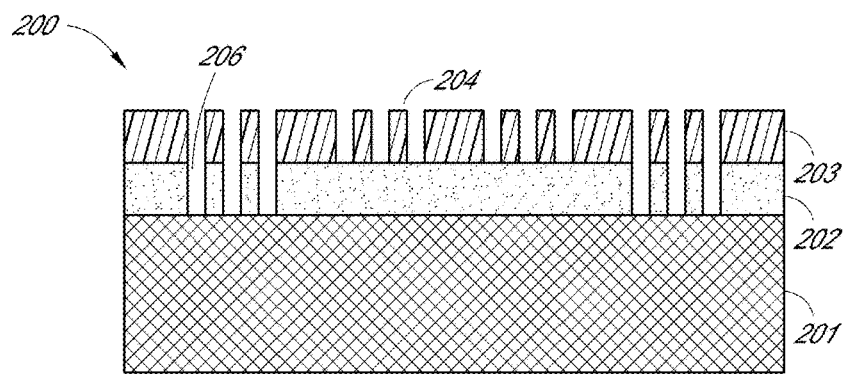

In some embodiments, the functionalizable layer comprises a plurality of micro-scale or nano-scale patterns, or combinations thereof, and at least a portion of the micro-scale or nano-scale patterns of the polymer and functionalizable layers perforate the polymer and functionalizable layers to expose the underlying backing layer. FIG. 2B depicts an substrate 200 according to another embodiment of the present invention, where the functionalizable layer 202 comprises a plurality of nano-scale patterns 204 and 206, and nano-scale patterns 206 perforate the polymer layer 203 and the functionalizable layer 202 to expose the underlying backing layer 201.

Figure 2C:
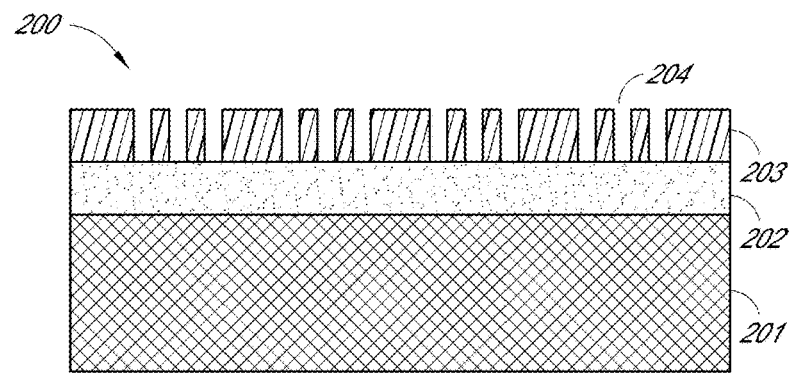

In some embodiments, as shown in FIG. 2C, each of the nano-scale patterns 204 of the polymer layer 203 perforates the polymer layer to expose the underlying functionalizable layer 202.

Figure 2D:
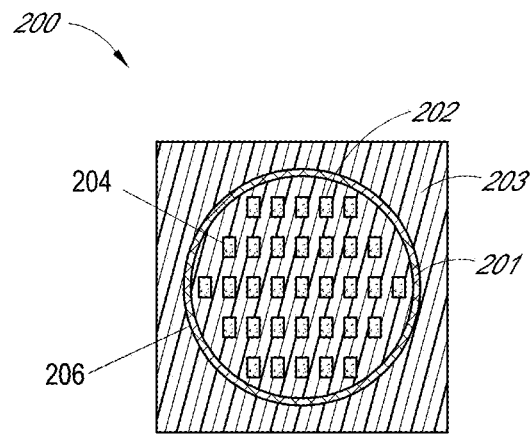
FIG. 2D is a top view of a substrate where a functionalizable layer is disposed between a polymer layer and a backing layer.

FIG. 2D illustrates a top view of a substrate of FIG. 2B where nano-scale patterns 204 expose the underlying functionalizable layer 202 and nano-scale patterns 206 perforate the polymer and functionalizable layers to expose the underlying backing layer 201.

Figure 2E:
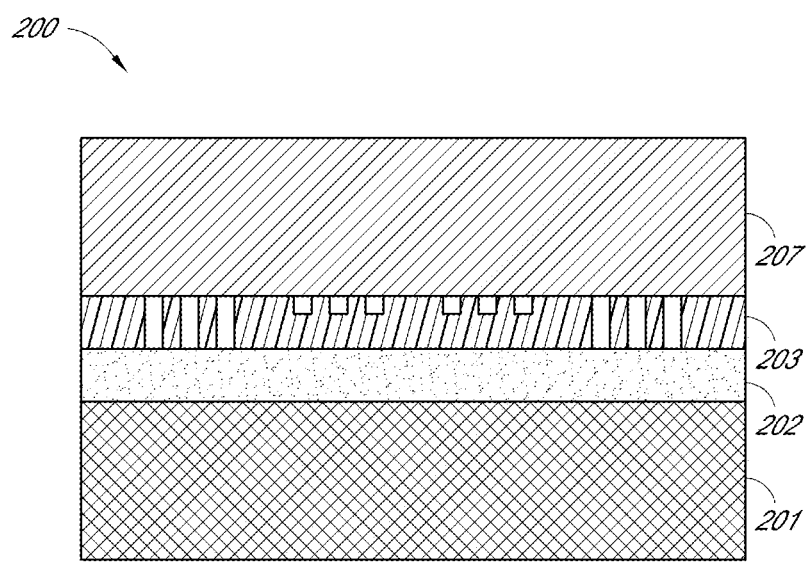
FIG. 2E is a cross-section view of a substrate where a functionalizable layer and a polymer layer are disposed between a backing layer and a sealing layer.

In some embodiments, the substrate can further comprise a sealing layer to substantially seal the polymer layer and the functionalizable layer between the backing layer and the sealing layer. As shown in FIG. 2E as a cross-section view of a substrate according to an embodiment of the present invention, a sealing layer 207 substantially seals the polymer layer 203 and the functionalizable layer 202 between the sealing layer 207 and the backing layer 201.

In some embodiments, the sealing layer can be optically transparent. In some embodiments, there can be some space in between the sealing layer and the polymer layer to allow sample fluid flowing through.

In some embodiments, the polymer layer is disposed between the backing layer and the functionalizable layer.

Figure 3A:
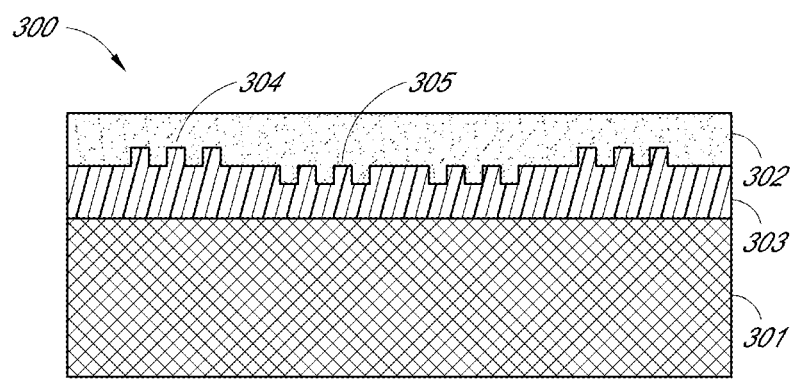
FIGS. 3A-3C are cross-section views of several embodiments of a substrate wherein a polymer layer is disposed between a functionalizable layer and a backing layer.
Figure 3B:
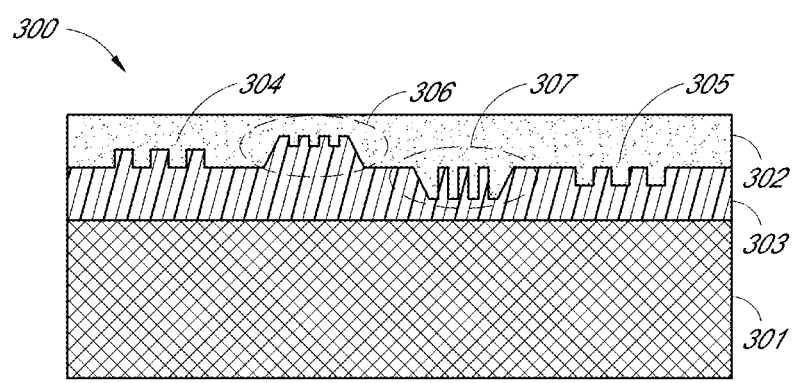
Figure 3C:
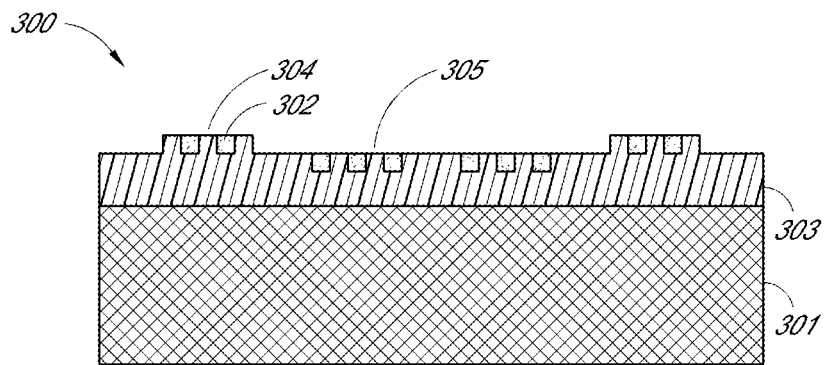

FIGS. 3A-3C illustrate the cross-section views of a substrate 300 according to some embodiments of the present invention comprising a functionalizable layer 302 comprising one or more functional groups; a polymer layer 303 comprising a plurality of micro-scale or nano-scale patterns, or combinations thereof; and a backing layer 301, where the polymer layer 303 is disposed between the functionalizable layer 302 and the backing layer 301.

As shown in FIG. 3A, a substrate 300 comprises at least three layers, a backing layer 301, a functionalizable layer 302 and a polymer layer 303, where the polymer layer 303 lays in between the functionalizable layer 302 and the backing layer 301. The polymer layer 303 comprises a plurality of nano-scale patterns 304 (nano posts) and 305 (nano wells).

In some other embodiments, the nano-scale patterns of the polymer layer can be uniform in size and shape.

In some embodiments, the polymer layer has a combination of both micro-scale and nano-scale patterns. As shown in FIG. 3B, the polymer layer 303 further comprises a plurality of micro-scale patterns 306 and 307. In FIGS. 3A and 3B, the underlying polymer layer 303 is not exposed.

FIG. 3C depicts the cross-section view of the substrate 300 of FIG. 3A when excess functionalizable layer 302 is removed except for those resides within the nano-scale patterns 304 and 305.

Figure 4A:
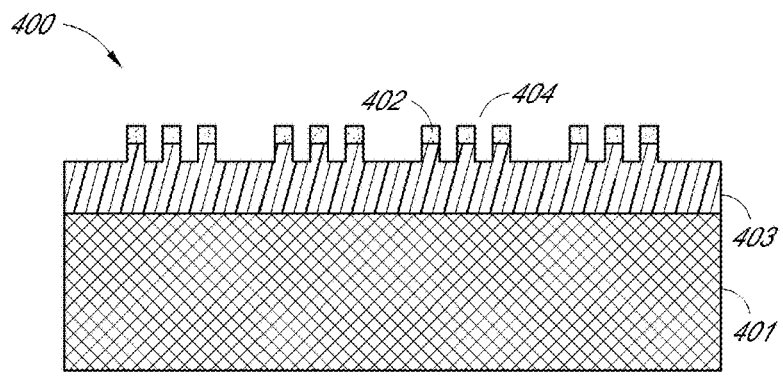
FIGS. 4A and 4B are cross-section views of several embodiments of a substrate where a functionalizable layer is disposed between a polymer layer and a backing layer.

In some embodiments, the functionalizable layer comprises a plurality of micro-scale or nano-scale patterns, or combinations thereof, where at least a portion of the micro-scale or nano-scale patterns of the functional layer perforate the functionalizable layer to expose the underlying polymer layer. FIG. 4A illustrates the cross-section view of a substrate 400 according to an embodiment of the present invention having a functionalizable layer 402 comprising nano-scale patterns 404 and where the nano-scale patterns 404 perforate the functionalizable layer 402 to expose the underlying polymer layer 403.

Figure 4B:
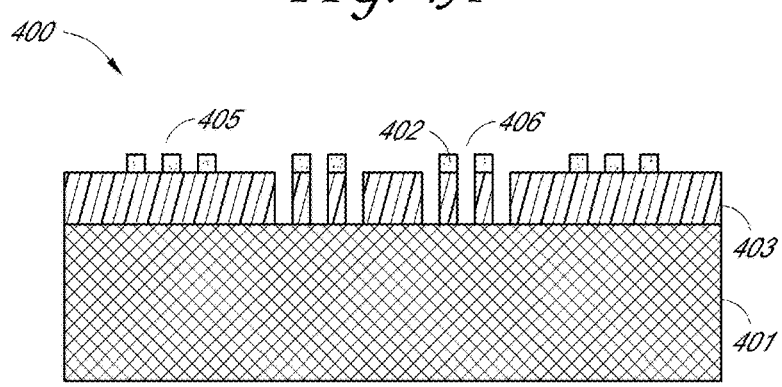

In some such embodiments, at least a portion of the micro-scale or nano-scale patterns of the functionalizable and polymer layers perforate the functionalizable and polymer layers to expose the underlying backing layer. FIG. 4B depicts a substrate 400 according to an embodiment of the present invention, where the functionalizable layer 402 and polymer layer 403 comprise a plurality of nano-scale patterns 406, which perforate the polymer layer 403 and functionalizable layer 402 to expose the underlying backing layer 401, while nano-scale patterns 405 do not perforate the polymer layer 403. In some embodiments, the polymer layer itself can comprise perforated nano-scale patterns to expose the underlying backing layer 401.

Figure 4C:
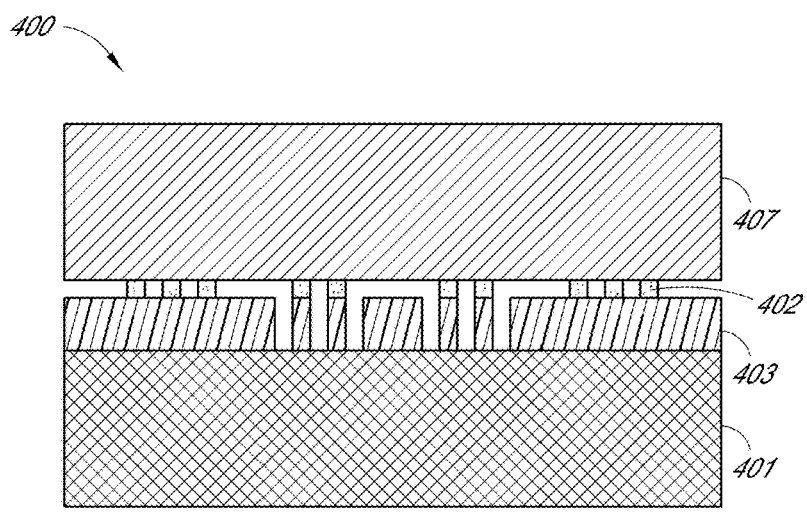
FIG. 4C is a cross-section view of a substrate where a functionalizable layer and a polymer layer are disposed between a backing layer and a sealing layer.

In some embodiments, the substrate can further comprise a sealing layer to substantially seal the polymer layer and the functionalizable layer between the backing layer and the sealing layer. As shown in FIG. 4C, a sealing layer 407 substantially seals the polymer layer 403 and the functionalizable layer 402 between the sealing layer 407 and the backing layer 401.

In some embodiments, the sealing layer can be optically transparent. In some embodiments, there can be some space in between the sealing layer and the functionalizable layer to allow sample fluid flowing through.

In some embodiments, the substrate is in the shape of a cylinder. In some such embodiments, the backing layer is closer to an outer surface of the cylinder than the functionalizable or polymer layer of the substrate. In some such embodiments, the backing layer is closer to an inner surface of the cylinder than the functionalizable or polymer layer of the substrate. In some embodiments, a sample fluid can flow through the inner surface of the cylinder substrate along its longitudinal axis.

Figure 5A:
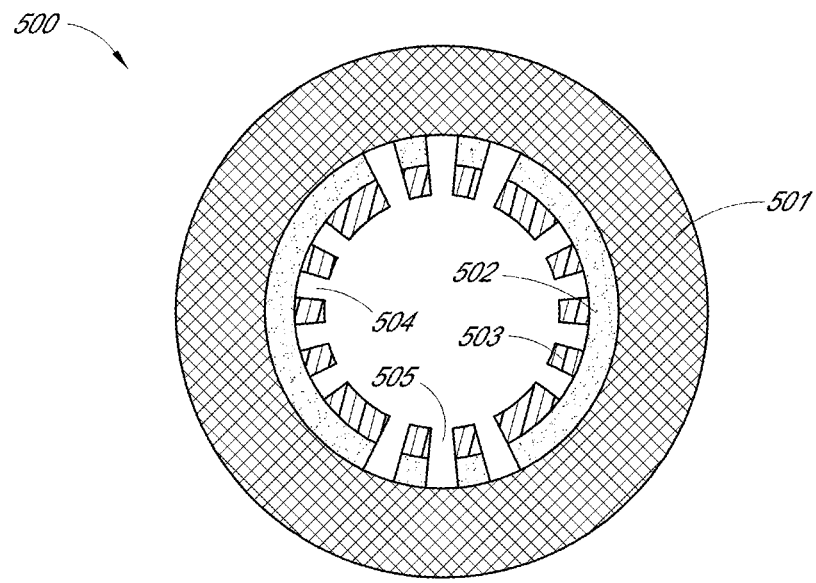
FIGS. 5A and 5B are cross-section views of several embodiments of a substrate in the shape of a cylinder.
Figure 5B:
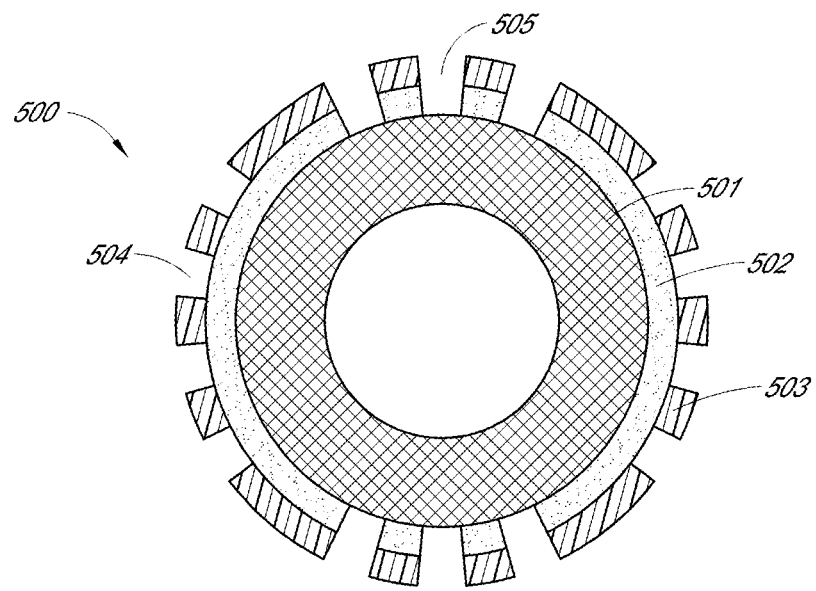

FIGS. 5A, 5B, 6A and 6B are radial cross-section views of substrates 500 and 600 according to some embodiments of the present invention in the shape of a cylinder. As shown in FIG. 5A, a backing layer 501 is closer to an outer surface of the cylinder than the functionalizable layer 502 or polymer layer 503 of the substrate 500. Further, the functionalizable layer 502 comprises a plurality of nano-scale patterns 504 and 505. Nano-scale patterns 504 perforate the polymer layer 503 to expose the underlying functionalizable layer 502. Nano-scale patterns 505 perforate the polymer layer 503 and the functionalizable layer 502 to expose the underlying backing layer 501. In FIG. 5B, the backing layer 501 is closer to an inner surface of the cylinder than the functionalizable layer 502 or polymer layer 503 of the substrate 500.

Figure 6A:
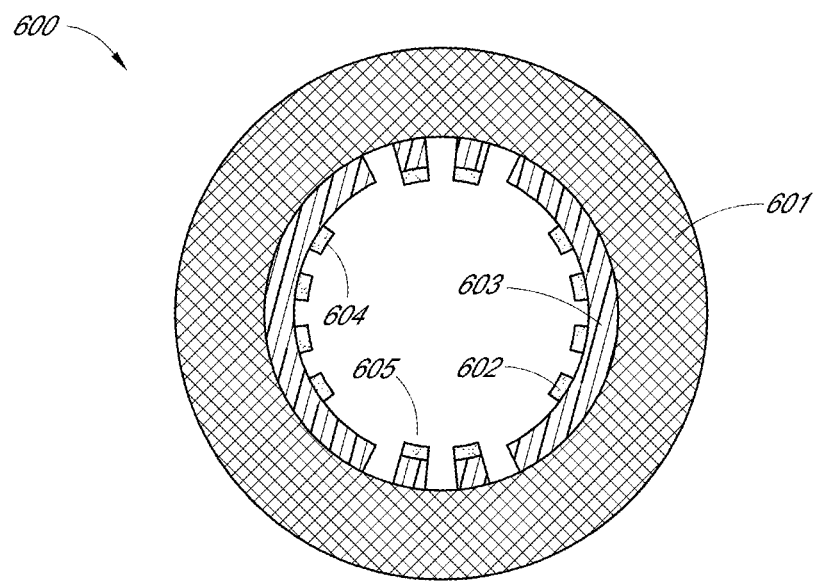
FIGS. 6A and 6B are cross-section views of several embodiments of a substrate in the shape of a cylinder.
Figure 6B:
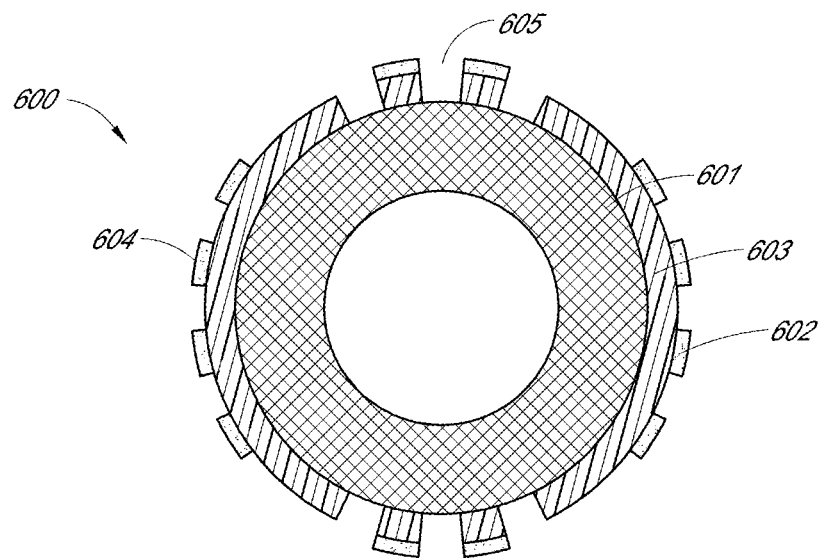

Similarly, FIG. 6A illustrate a substrate 600 according to an embodiment of the present application with a backing layer 601 is closer to an outer surface of the cylinder than the functionalizable layer 602 or polymer layer 603 of the substrate 600. Further, the functionalizable layer 602 comprises a plurality of nano-scale patterns 604 and 605. Nano-scale patterns 604 perforate the functionalizable layer 602 to expose the underlying polymer layer 603 and nano-scale patterns 605 perforate the polymer layer 603 and functionalizable layer 602 to expose the underlying backing layer 601. In FIG. 6B, the backing layer 601 of the substrate 600 according to an embodiment of the present application is closer to an inner surface of the cylinder than the functionalizable layer 602 or polymer layer 603 of the substrate 600.

Figure 7A:
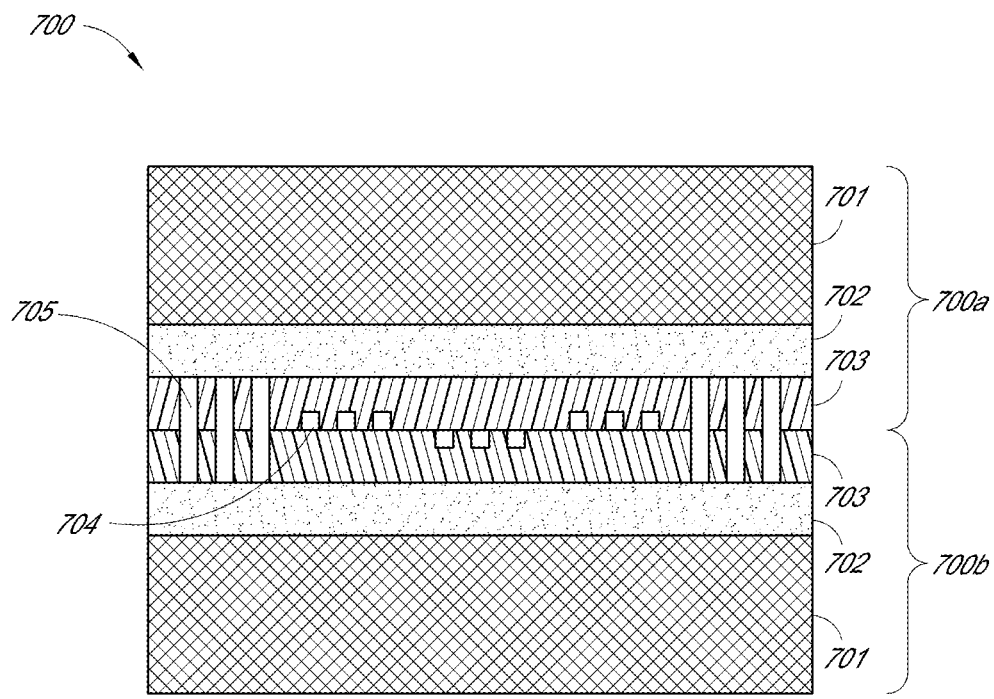
FIGS. 7A and 7B are cross-section views of several embodiments of two substrates stacking on top of another via contact or within close proximity of their distal surfaces (i.e. surfaces that are distal to their respective base layers).
Figure 7B:
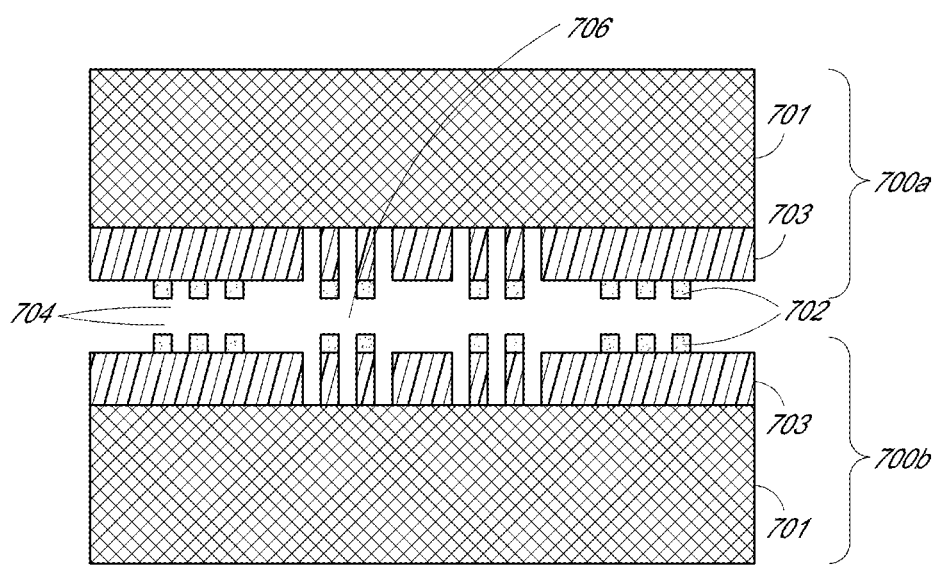

FIGS. 7A and 7B are cross-section views of a substrate 700 according to some embodiments of the present application formed by two substrates, where the polymer layers 703 and the functionalizable layers 702 are substantially sealed in between two backing layers 701. In FIG. 7A, the substrate 700 is formed by stacking substrate 700a on the distal surface of the substrate 700b such that the distal surface of the two polymer layers 703 are in contact with each other (the distal surface being referenced to the backing layer). Both substrates 700a and 700b comprise nano-scale patterns 704 and 705 in the polymer layers 703, where nano-scale patterns 705 perforate the polymer layers 703 to expose the underlying functionalizable layers 702.

In FIG. 7B, the substrate 700 is formed by stacking one substrate 700a on the distal surface of another substrate 700a such that the distal surfaces of the two functionalizable layers 702 are within close proximity to each other (e.g. in many embodiments the distal surfaces are in direct contact with each other). Nano-scale patterns 706 perforate the polymer layers 703 and the functionalizable layers 702 to expose the underlying backing layers 701. The spacing between the two functionalizable layers 702 can allow a sample fluid flowing through. One or more edges of the substrate 700 can be substantially sealed to avoid fluid leaking.

In any of the disclosed embodiments, the substrate can further comprise a sealing layer to substantially seal the polymer layer and the functionalizable layer between the backing layer and the sealing layer. In some such embodiments, the sealing layer is optically transparent.

In any of the disclosed embodiments, at least one of the micro-scale or nano-scale patterns is capable of admitting a sample fluid.

In any of the disclosed embodiments, the substrate can further comprise a fluid reservoir, for example, a sample, reagent or waste reservoir.

In any of the disclosed embodiments, the micro-scale or nano-scale patterns of the polymer layer can comprise channels, trenches, wells, posts, or combinations thereof. In some embodiments, at least a portion of the micro-scale or nano-scale patterns are posts. In some such embodiments, the posts have an average diameter of less than about 500 nm. In some such embodiments, the posts have an average diameter of about 330 nm or less including, for example, less than about 300 nm, 200 nm, 100 nm, or 50 nm. In some such embodiments, the posts have an average height of less than about 500 nm. In some further embodiments, the posts have an average height of about 300 nm or less including, for example, less than about 300 nm, 200 nm, 100 nm, or 50 nm. Alternatively or additionally to the exemplary upper limits the average diameter and/or average height of the posts can be at most 1 mm, 500 µm, 100 µm, 1 µm, 500 nm, 400 nm, 300 nm, 200 nm or 100 nm. In some embodiments, the plurality of micro-scale or nano-scale patterns, or combinations thereof, are made by mechanical embossing at room temperature.

Functionalizable Layers

In any of the disclosed embodiments, the functionalizable layer can comprise a reactive silane layer, functionalizable hydrogel or a functionalizable polymer. In some such embodiments, the functionalizable layer can comprise one or more functional groups. In some such embodiments, the functional group can be selected from the group consisting of optionally substituted alkene, azide, optionally substituted amine, carboxylic acid, optionally substituted hydrazone, halogen, hydroxy, optionally substituted tetrazole, optionally substituted tetrazine, thiol, and combinations thereof. In some further embodiments, the functionalizable layer comprises a polymer or hydrogel comprising Formula (Ia) or (Ib):

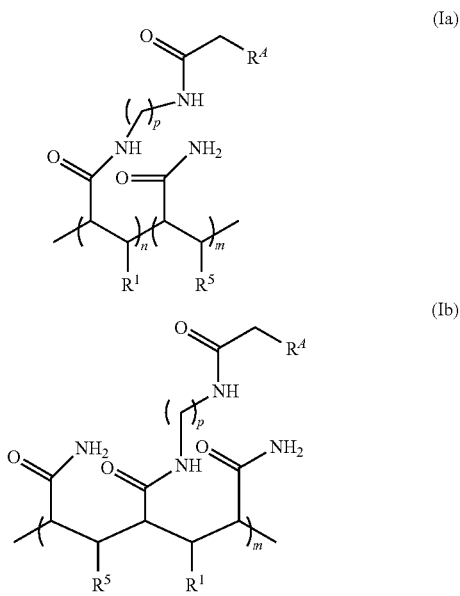

$R^1$ is H or optionally substituted alkyl; the functional group $R^4$ is selected from the group consisting of azide, optionally substituted amine, optionally substituted alkene, optionally substituted hydrazone, carboxylic acid, halogen, hydroxy, optionally substituted tetrazole, optionally substituted tetrazine, and thiol; $R^5$ is selected from H or optionally substituted alkyl; each of the —$(CH_2)$-p can be optionally substituted; p is an integer in the range of 1 to 50; n is an integer in the range of 1 to 50,000; and m is an integer in the range of 1 to 100,000. In some such embodiments, the functional groups comprise azides. In some embodiments, each $R^1$ and $R^5$ is hydrogen. In some embodiments, the functional group $R^4$ is azide. In some embodiments, p is 5. In one embodiment, the polymer or hydrogel comprised in the functionalizable layer is PAZAM. Methods for making and using PAZAM, and other functionalizable materials that can be used in a layer of a substrate of the present disclosure are described in U.S. patent application Ser. Nos. 13/784, 368 and 61/841,647.

Examples of reactive silanes that can be used include, but are not limited to, acrylate functional silanes, aldehyde functional silanes, amino functional silanes, anhydride functional silanes, azide functional silanes, carboxylate functional silanes, phosphonate functional silanes, sulfonate functional silanes, epoxy functional silanes, ester functional silanes, vinyl functional silanes, olefin functional silanes, halogen functional silanes and dipodal silanes with any or none of the above functional groups. Norbornene silanes are particularly useful and are described, for example, in U.S. Pat. App. Ser. No. 61/841,647. The choice of silane functionality can be made based on the reactivity of the material to which it will react. For example, amino functional silanes react with thermoplastics such as polyacrylate, polyamide, polyamide-imide, polybutylene terephthalate, polycarbonate, polyether ketone, polyethylene, polyphenylene sulfide, polysulfone, polyvinyl butyral and polyvinyl chloride. Vinyl and olefin functional silanes react with thermoplastics such as polyacetal, polyethylene, and polypropylene. Acrylate functional silanes react with thermoplastics such as polypropylene, and polystyrene.

In any of the disclosed embodiments, the functional groups of the functionalizable layer are attached to biomolecules. In some embodiments, the biomolecules are selected from amino acids, nucleosides, nucleotides, peptides, oligonucleotides, polynucleotides, nucleic acids, proteins, or combinations thereof. In some such embodiments, the biomolecules are nucleic acids.

Functionalizable Layer—Hydrogels

In some embodiments, the functionalizable layer can comprise a hydrogel. Non-limiting examples of hydrogels can be used in the present application are described herein.

WO 00/31148 discloses polyacrylamide hydrogels and polyacrylamide hydrogel-based arrays in which a so-called polyacrylamide prepolymer is formed, preferably from acrylamide and an acrylic acid or an acrylic acid derivative containing a vinyl group. Crosslinking of the prepolymer may then be affected. The hydrogels so produced are solid-supported, preferably on glass. Functionalization of the solid-supported hydrogel may also be effected.

WO 01/01143 describes technology similar to WO00/31148 but differing in that the hydrogel bears functionality capable of participating in a [2+2] photocycloaddition reaction with a biomolecule so as to form immobilized arrays of such biomolecules. Dimethylmaleimide (DMI) is a particularly preferred functionality. The use of [2+2] photocycloaddition reactions, in the context of polyacrylamide-based microarray technology is also described in WO02/12566 and WO03/014392.

U.S. Pat. No. 6,465,178 discloses the use of reagent compositions in providing activated slides for use in preparing microarrays of nucleic acids; the reagent compositions include acrylamide copolymers.

WO 00/53812 discloses the preparation of polyacrylamide-based hydrogel arrays of DNA and the use of these arrays in replica amplification.

Once hydrogels have been formed, biomolecules may then be attached to them so as to produce molecular arrays, if desired. Attachment has been effected in different ways. For example, U.S. Pat. No. 6,372,813 teaches immobilization of polynucleotides bearing dimethylmaleimide groups to the hydrogels produced which bear dimethylmaleimide groups by conducting a [2+2] photocycloaddition step between two dimethylmaleimide groups—one attached to the polynucleotide to be immobilized and one pendant from the hydrogel.

Where the molecular array is formed after generation of the hydrogel, two strategies can be employed to achieve this end. Firstly, the hydrogel may be modified chemically after it is produced. A more common alternative is to effect polymerization with a co-monomer having a functionality primed or pre-activated to react with the molecules to be arrayed.

Alternatives to initial formation of hydrogels followed by subsequent arraying of molecules thereto have been described, for example, where the array is formed at the same time as the hydrogel is produced. This may be effected by, for example, direct copolymerization of acrylamide-derivatized polynucleotides. An example of this approach is described in WO01/62982 in which acrylamide-derivatized polynucleotides are mixed with solutions, of acrylamide and polymerization is effected directly.

Mosaic Technologies (Boston, Mass., USA) produce ACRYDITE™ (an acrylamide phosphoramidite) which can be reacted with polynucleotides prior to copolymerization of the resultant monomer with acrylamide.

Efimov et al. (Nucleic Acids Research, 1999, 27 (22), 4416-4426) disclose a further example of a simultaneous formation of hydrogel/array in which copolymerization of acrylamide, reactive acrylic acid derivatives and the modified polynucleotides having 5'- or 3'-terminal acrylamide groups is affected.

The compositions and methods set forth above and in the references cited above can be used in the compositions and methods set forth herein. For example, the hydrogels can be used as functionalizable layers in a substrate set forth herein.

Functionalizable Layer—Polymers

In some embodiments, the functionalizable layer can comprise a polymer with one or more functional groups that are capable of reacting with biomolecules of interest. In some such embodiments, the functional group can be selected from the group consisting of optionally substituted alkene, azide, optionally substituted amine, carboxylic acid, optionally substituted hydrazone, halogen, hydroxy, optionally substituted tetrazole, optionally substituted tetrazine, thiol, and combinations thereof. Non-limiting examples of the polymers can be used in the present application are described herein, including those described in U.S. Ser. No. 13/784,368 and U.S. Pat. Pub. No. 2011/0059865, which are hereby incorporated by references in their entireties.

PAZAM

In some embodiments, the polymer of Formula (Ia) or (Ib) is also represented by Formula (IIa) or (IIb):

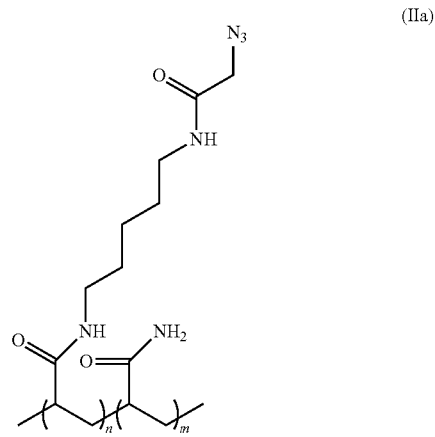

(IIa)

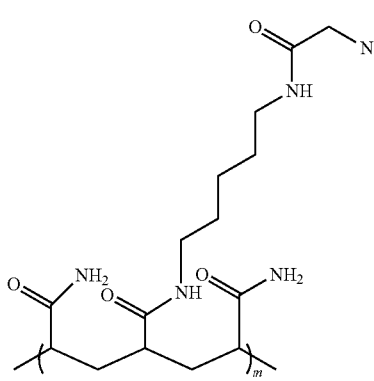

(IIb)

wherein n is an integer in the range of 1-20,000, and m is an integer in the range of 1-100,000.

In some embodiments, the functionalized molecule used for direct conjugation is poly(N-(5-azidoacetamidylpentyl)acrylamide-co-acrylamide) (PAZAM). PAZAM can be prepared by polymerization of acrylamide and Azapa (N-(5-(2-azidoacetamido)pentyl)acrylamide) in any ratio. In some embodiments, PAZAM is a linear polymer. In some other embodiments, PAZAM is a lightly cross-linked polymer. In some embodiments, PAZAM is applied as an aqueous solution. In some other embodiments, PAZAM is applied as an aqueous solution with one or more solvent additives, such as ethanol. The method for preparation different PAZAM polymers is discussed in details in U.S. Ser. No. 13/784,368, which is hereby incorporated by reference in its entirety.

Polymer Layer—Photocurable Polymer

In any of the disclosed embodiments, the polymer layer can comprise at least one photocurable polymer. In some embodiments, the photocurable polymer comprises a urethane, acrylate, silicone, epoxy, polyacrylic acid, polyacrylates, epoxysilicone, epoxy resins, polydimethylsiloxane (PDMS), silsesquioxane, acyloxysilanes, maleate polyesters, vinyl ethers, monomers with vinyl or ethynyl groups, or copolymers and combinations thereof.

In any of the disclosed embodiments, the backing layer may be, for example, no more than about 10 nm, 50 nm, 100 nm, 1 µm, 10 µm, 100 µm, 500 µm, 1 mm, 5 mm, 1 cm, or 10 cm in thickness. Alternatively or additionally, the backing layer is no less than about 10 nm, 50 nm, 100 nm, 1 µm, 10 µm, 100 µm, 500 µm, 1 mm, 5 mm, 1 cm, or 10 cm in thickness.

In any of the disclosed embodiments, the polymer layer is no more than about the length of a carbon-carbon bond, 1 nm, 10 nm, 50 nm, 100 nm, 1 µm, 10 µm, 100 µm, 500 µm, 1 mm, 5 mm, 1 cm, or 10 cm in thickness. In some embodiments, the polymer layer is no less than about 10 nm, 50 nm, 100 nm, 1 µm, 10 µm, 100 µm, 500 µm, 1 mm, 5 mm, 1 cm, or 10 cm in thickness.

In any of the disclosed embodiments, the functionalizable layer is no more than about the length of a carbon-carbon bond, 1 nm, 10 nm, 50 nm, 100 nm, 1 µm, 10 µm, 100 µm, 500 µm, 1 mm, 5 mm, 1 cm, or 10 cm in thickness. In some embodiments, the functionalizable layer is no less than about 10 nm, 50 nm, 100 nm, 1 µm, 10 µm, 100 µm, 500 µm, 1 mm, 5 mm, 1 cm, or 10 cm in thickness.

Exemplary dicing tapes that can be used in a composition or method set forth herein include, but are not limited to, Lintec KL-3225 UV tape; Ultron Systems, Anti-Static UV Adhesive Plastic Film (p/n: 1043R-9.05), or AIT UVR250 (AI Technology Inc., Princeton Junction, N.J.). Other useful dicing tapes are commercially available from Semiconductor Equipment Corp. (Moorpark, Calif.) such as Low Tack, expandable PVC, 80 µm thick (P/N 24213), Extra High Tack, non-expandable Polyethylene, 90 µm thick (P/N 24216), Super High Tack, expandable Polyolefin, 85 µm thick (P/N 24339), or Super High Tack, expandable Polyolefin, 170 µm thick (P/N 24351). The UC series of UV tapes for wafer dicing sold by Furukawa Electric Co., Ltd (Tokyo, Japan) are also useful.

Backing Layer

In any of the disclosed embodiments, the backing layer can be made of a material selected from the group consisting of silica, plastic, quartz, metal, metal oxide, paper and combinations thereof. In some such embodiments, the backing layer is made of a flexible plastic material. In some embodiments, the flexible plastic material has a stiffness that is sufficient to preclude the backing layer from conforming to nano-scale or micro-scale contours on a solid support when the backing layer is contacted with the solid support in a method set forth herein. For example, the contacting between the solid support and backing layer may occur under sufficient pressure that a negative replicate of the nano-scale or micro-scale contours is transferred to an adhesive layer that is attached to the backing layer; yet the backing layer will have sufficient stiffness to resist deformation permanently or in some cases even temporarily. In some such embodiments, the backing layer is made from a roll of thin flexible film. Non-limiting examples of backing layers that can be used in the present application are described herein.

In some embodiments, backing layers used in the present application include silica-based materials, such as glass, fused silica and other silica-containing materials. In some embodiments, silica-based substrates can also be silicon, silicon dioxide, silicon nitride, silicone hydrides. In some embodiments, backing layers used in the present application include plastic materials such as polyethylene, polystyrene, poly(vinyl chloride), polypropylene, nylons, polyesters, polycarbonates and poly(methyl methacrylate). Preferred plastics materials are poly(methyl methacrylate), polystyrene and cyclic olefin polymer substrates.

In some other embodiments, the backing layer can be a metal. In some such embodiments, the metal is gold. In some embodiments, the backing layer has at least one surface comprising a metal oxide. In one embodiment, the surface comprises a tantalum oxide.

Acrylamide, enone, or acrylate may also be utilized as a backing layer material. Other backing layer materials can include, but are not limited to gallium aresnide, indium phosphide, aluminum, ceramics, polyimide, quartz, resins, polymers and copolymers. The foregoing lists are intended to be illustrative of, but not limited to the present application.

In some embodiments, the backing layer and/or the backing layer surface can be quartz. In some other embodiments, the backing layer and/or the backing layer surface can be semiconductor, i.e. GaAs or ITO.

In some embodiments, the backing layer is made of paper.

In some embodiments, the backing layer is made of a flexible material. In some such embodiments, the backing layer is made from a roll of thin flexible film (for example, having a thickness of less than about 1 mm, 500 µm, 100 µm, or less.

Backing layers can comprise a single material or a plurality of different materials, for example, two or more layers of one or more materials. The shape of the backing layers employed may be varied in accordance with the application for which the present application is practiced.

Doped Layers

One or more of the layers that is present in a composition or used in a method set forth herein can be doped with a material having a desired characteristic. For example, a layer can have plasmonic properties due to the presence of nanoparticles, Q dots or the like spiked into the material of the layer. The resulting plasmonic properties can provide an antenna effect during a subsequent detection step that is carried out in or on the doped layer. Alternatively or additionally, a layer can be doped with receptors, ligands or nucleic acids to provide binding specificity in an analytical detection application; or doped with reactive moieties, such as those set forth herein in the context of functionalizable layers, to provide for subsequent functionalization; or doped with materials that alter optical properties of the layer such as optical filter materials, materials that absorb light in a particular wavelength range, materials that emit light in a particular wavelength range, or materials that scatter light; or doped with materials that impart conductive characteristics such as electrical conductivity; or doped with materials that are thermally conductive.

In particular embodiments, a layer can be doped prior to use in a method set forth herein. For example, one or more layer of a substrate can be doped prior to creation of a pattern in the substrate. By way of more specific example, a polymer layer or functionalizable layer can be doped prior to creation of a pattern in the polymer layer. As such, the dopant material in the polymer layer will form part of the pattern, being displaced from some regions of the pattern and retained in other regions of the pattern. A dopant material that is in a functionalizable layer can be exposed in some portions of the pattern and protected in other parts of the pattern to allow for selective detection or reactivity of the exposed portions in a subsequent use of the substrate.

One or more of the layers set forth herein can be doped, including, for example, a polymer layer, functionalizable layer, or backing layer. The dopant material can be present primarily or solely on the surface of a layer, within the volume of a layer, or both within the layer and on the surface of the layer.

Substrate Applications

In some embodiments, a substrate described herein forms at least part of a flow cell or is located in a flow cell. In some such embodiments, the flow cells further comprise polynucleotides attached to the surface of the substrate via reaction with the functional groups of the functionalizable layer, for example, a hydrogel coating. In some embodiments, the functionalizable layer is disposed between the polymer layer and the backing layer, with at least a portion of the micro-scale or nano-scale patterns of the polymer layer are perforated to expose the underlying functionalizable layer. In some embodiments, the polymer layer is disposed between the functionalizable layer and the backing layer, with at least a portion of the micro-scale or nano-scale patterns of the functionalizable layer are perforated to expose the underlying polymer layer.

In some embodiments, the polynucleotides are present in the flow cells in polynucleotide clusters, wherein the polynucleotides of the polynucleotide clusters are attached to a surface of the flow cell via the hydrogel coating. Clusters can be formed by solid-phase amplification techniques such as solid-phase PCR, bridge amplification or other techniques known in the art or described in U.S. Pat. No. 5,641,658; U.S. Patent Publ. No. 2002/0055100; U.S. Pat. No. 7,115,400; U.S. Patent Publ. No. 2004/0096853; U.S. Patent Publ. No. 2004/0002090; U.S. Patent Publ. No. 2007/0128624; and U.S. Patent Publ. No. 2008/0009420, each of which is incorporated herein by reference. In preferred embodiments, the flow cell is a flow chamber that is divided into a plurality of lanes or a plurality of sectors, wherein one or more of the plurality of lanes or plurality of sectors comprises a surface that is coated with a covalently attached functionalizable hydrogel coating described herein. In some embodiments of the flow cells described herein, the attached polynucleotides within a single polynucleotide cluster have the same or similar nucleotide sequence. In some embodiments of the flow cells described herein, the attached polynucleotides of different polynucleotide clusters have different or nonsimilar nucleotide sequences. Exemplary flow cells and substrates for manufacture of flow cells that can be used in method or composition set forth herein include, but are not limited to, those commercially available from Illumina, Inc. (San Diego, Calif.) or described in US 2010/0111768 A1 or US 2012/0270305, each of which is incorporated herein by reference.

In some embodiments, a substrate described herein forms at least part of a microfluidic device or is located within a microfluidic device. Exemplary devices include flow cells useful in nucleic acid sequencing and other analytical procedures such as the flow cells commercially available from Illumina, Inc. (San Diego, Calif.) or described in U.S. 2010/0111768 A1 or U.S. 2012/0270305 A1, each of which is incorporated herein by reference. Other microfluidic devices include cell sorting devices, lab on a chip devices, capillary sequencers, cell counting devices and the like can also be prepared at least in part from a substrate described herein or comprise a substrate described herein.

Substrates Preparation

Some embodiments disclosed herein include a process for preparing a substrate, comprising: providing a substrate comprising a functionalizable layer comprising one or more functional groups disposed between a backing layer and a layer of photocurable polymer; contacting a surface of the layer of photocurable polymer with a template having a plurality of micro-scale or nano-scale patterns including micro-scale or nano-scale wells, posts, channels, junctions or combinations thereof; applying pressure to the template or substrate to transfer the micro-scale or nano-scale patterns to at least the layer of photocurable polymer, where the contacting and applying are performed at room temperature; irradiating the photocurable polymer with UV light to cure the photocurable polymer; and separating the template from substrate; where at least a portion of the polymer layer is perforated to expose the underlying functionalizable layer.

FIGS. 8A-8D are cross-section views to illustrate a UV nano-embossing process to prepare a substrate 800 according to an embodiment of the present invention.

Figure 8A:
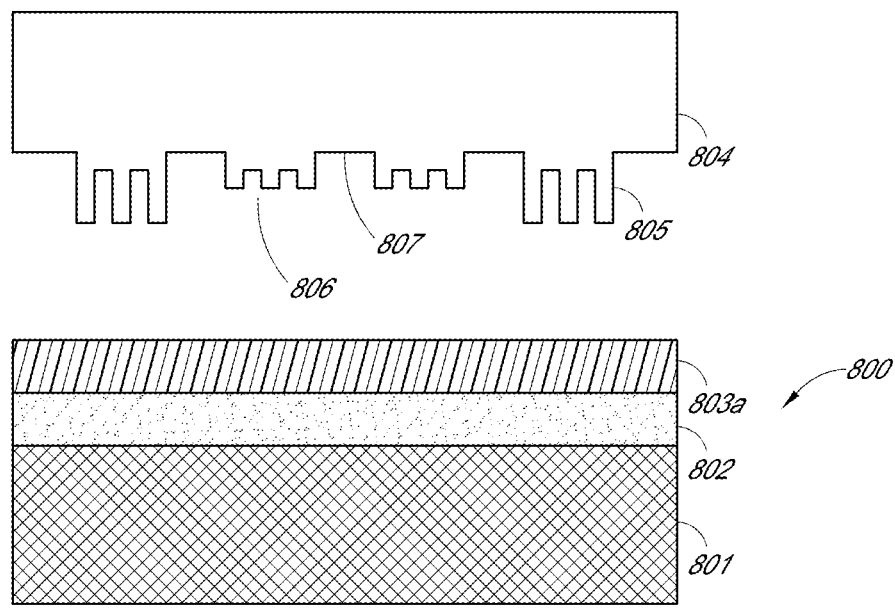
FIGS. 8A-8D are cross-section views describing an embodiment of a process for preparing a substrate where a functionalizable layer is disposed between a polymer layer and a backing layer using a template comprising a plurality of micro-scale or nano-scale patterns.

In FIG. 8A, an embossed stamp 804 comprises a plurality of nano-scale patterns 805 and 806 thereon, and a plurality of grooves 807 in between the nano-scale patterns. A substrate 800 comprising a backing layer 801, a functionalizable layer 802 and a photocurable polymer layer 803a is also provided.

Figure 8B:
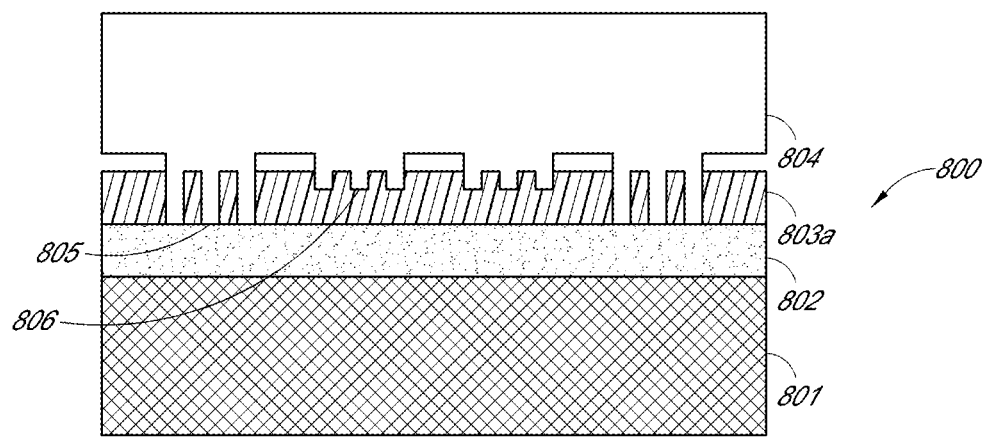

Next, the embossed stamp 804 is contacted with an upper surface of the photocurable polymer layer 803a, then pressure is applied to the embossed stamp 804 or the substrate 800 as shown in FIG. 8B. The nano-scale patterns 805 and 806 are formed in the photocurable polymer layer 803a of the substrate 800.

Figure 8C:
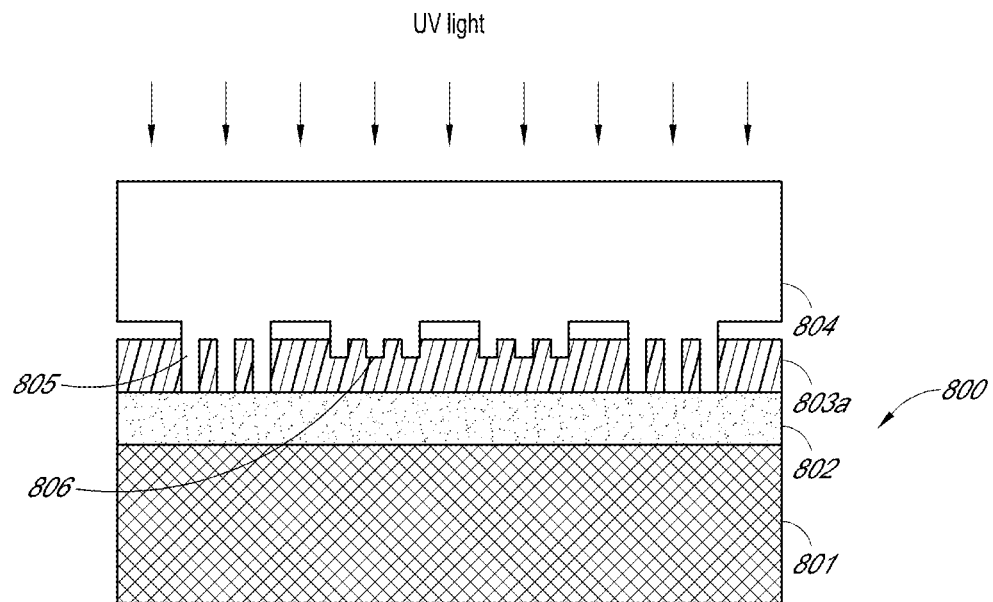

Then, UV light is irradiated onto the UV curable polymer layer 803a through the embossed stamp 804 as shown in FIG. 8C. The embossed stamp 804 is made of a material that allows UV light to pass through such that UV light reaches the photocurable polymer layer 803a and cure the photocurable polymer, forming a polymer layer 803. Alternatively, the UV light can be applied through the backing layer 801 if the backing layer and functionalizable layer 802 are made of materials that allow UV light to pass through.

Figure 8D:
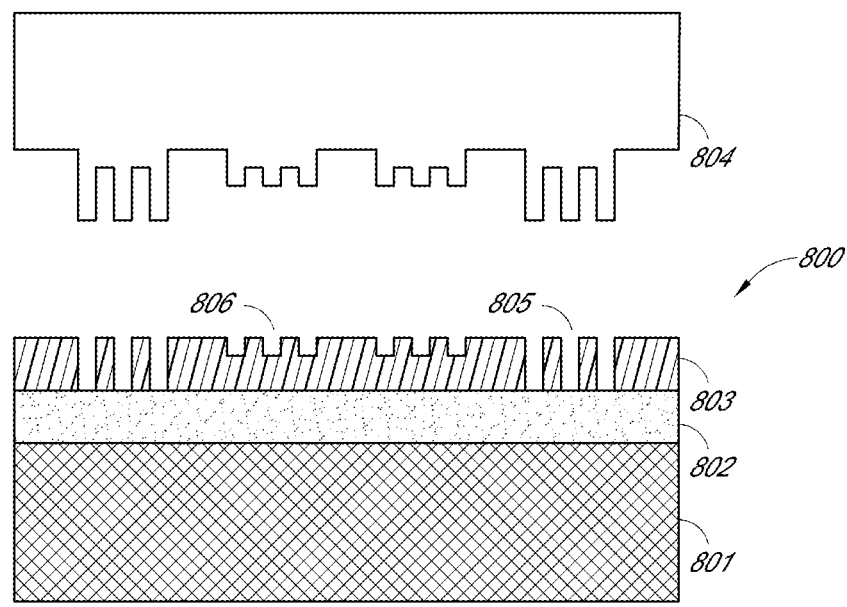

Next, the embossed stamp 804 is separated from the polymer layer 803 resulting in the formation of nano-scale patterns 805 and 806 in the substrate 800 as shown in FIG. 8D. Nano-scale patterns 805 perforate the polymer layer 803 to expose the underlying functionalizable layer 802.

Some embodiments disclosed herein include a process for preparing a substrate, comprising: providing a template comprising a plurality of micro-scale or nano-scale patterns including micro-scale or nano-scale wells, channels or combinations thereof on a surface of the template; depositing a functional layer comprising one or more functional groups on the surface of the template such that at least a portion of the micro-scale or nano-scale wells, channels or combinations thereof contain the functional layer; removing excess functionalizable layer from the surface of the template such that the functionalizable layer is present on only a portion of the template surface; providing a substrate comprising a backing layer having a photocurable polymer layer disposed on the backing layer; contacting a surface of the photocurable polymer layer with the surface of the template having the plurality of micro-scale or nano-scale patterns and functionalizable layer thereon; applying pressure to the template or substrate to transfer the micro-scale or nano-scale pattern to at least the layer of photocurable polymer, where the contacting and applying are performed at room temperature; irradiating the photocurable polymer with UV light to cure the photocurable polymer; and separating the template from the substrate; where at least a portion of the functionalizable layer is transferred to the polymer layer.

FIGS. 9A-9E are cross-section views to illustrate a UV nano-embossing process to prepare a substrate 900 according to an embodiment of the present invention.

Figure 9A:
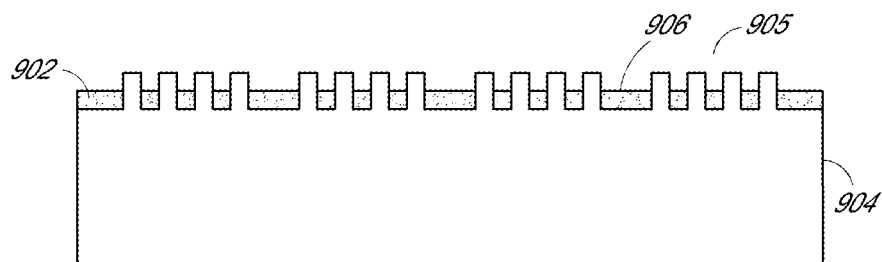
FIGS. 9A-9E are cross-section views describing an embodiment of a process for preparing a substrate where a polymer layer is disposed between a functionalizable layer and a backing layer using a template comprising a plurality of micro-scale or nano-scale patterns.

In FIG. 9A, an embossed stamp 904 comprises a plurality of nano-scale patterns 905 thereon, and a plurality of grooves 906 in between the nano-scale patterns 905. A functionalizable layer 902 is deposited on the nano-scale patterned surface of the embossed stamp 904.

Figure 9B:
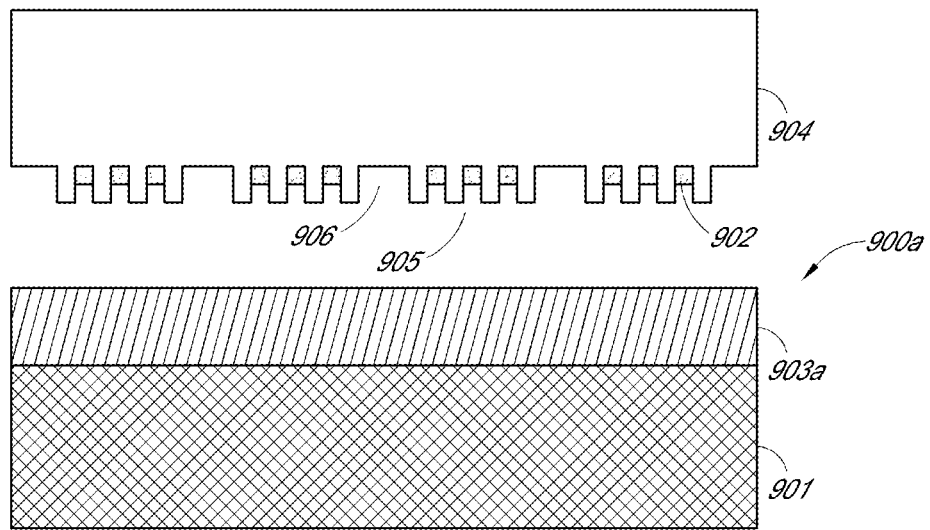

Next, in FIG. 9B, excess functionalizable layer 902 is removed such that the functionalizable layer is only present within the nano-scale patterns 905 of the embossed stamp 904. A substrate 900a having a backing layer 901 and a photocurable polymer layer 903a is provided.

Figure 9C:
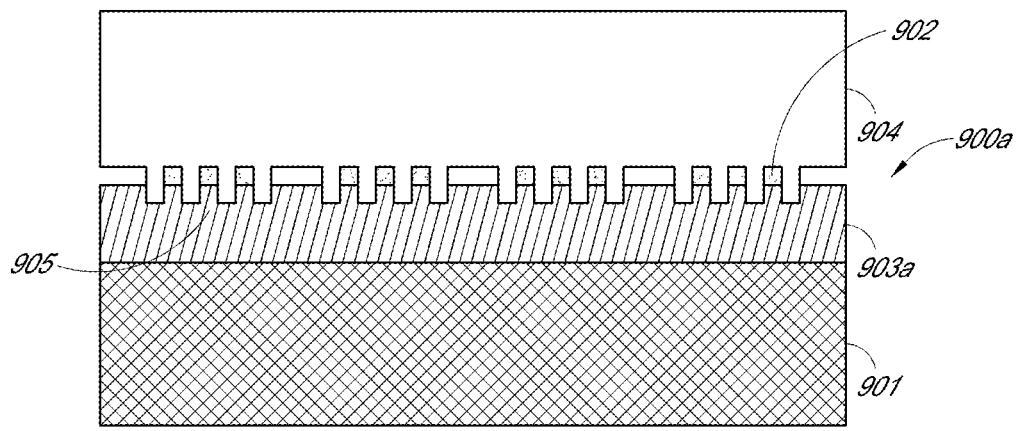

Then, the embossed stamp 904 is contacted with an upper surface of the photocurable polymer layer 903a, and then pressure is applied to the embossed stamp 904 or the substrate 900a as shown in FIG. 9C. The nano-scale patterns 905 are formed in the photocurable polymer layer 903a of the substrate 900a.

Figure 9D:
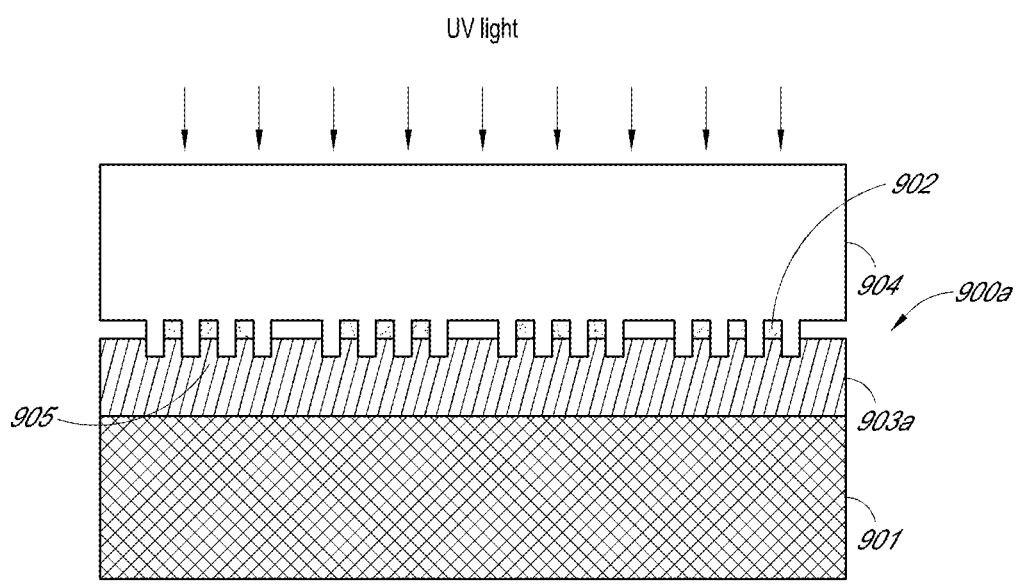

Next, UV light is irradiated onto the UV curable polymer layer 903a through the embossed stamp 904 as shown in FIG. 9D. The embossed stamp 904 is made of a material that allows UV light to pass through such that UV light reaches the photocurable polymer layer 903a and cure the photocurable polymer, forming a polymer layer 903. Alternatively, the UV light can be applied through the backing layer 901 if the backing layer 901 is made of materials that allow UV light to pass through.

Figure 9E:
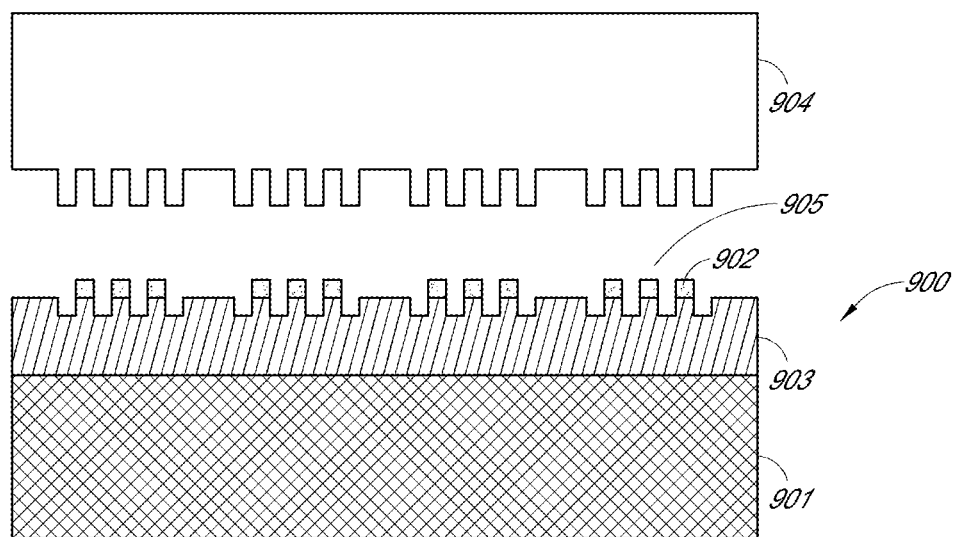

Finally, the embossed stamp 904 is separated from the polymer layer 903. The functionalizable layer 902 is transferred to the top surface of the polymer layer 903. In addition, nano-scale patterns 905 are formed in the polymer layer 903 as shown in FIG. 9E.

In some embodiments, the embossed stamp can have micro-scale or nano-scale patterns that result in at least a portion of polymer layer and functionalizable layer being perforated to expose the underlying backing layer.

In some embodiments, the substrate further comprises a backing layer having a photocurable polymer layer disposed on the backing layer is a roll of flexible dicing tape.

In any of the disclosed process embodiments, the process can further comprises applying a sealing layer to the substrate after removing the template to substantially seal the polymer layer and the functionalizable layer between the backing layer and the sealing layer.

In some embodiments, the sealing layer further comprises a second substrate prepared by the process of any of the disclosed embodiments, where the functionalizable layers and photocurable polymer layers of the substrates are disposed between the backing layers of the substrates. In some such embodiments, the sealing layer is optically transparent.

In any of the disclosed process embodiments, the process can further comprise forming the substrate into a cylinder. In some embodiments, the backing layer is closer to an outer surface of the cylinder than the functionalizable or polymer layer of the substrate. In some other embodiments, the backing layer is closer to an inner surface of the cylinder than the functionalizable or polymer layer of the substrate. In some embodiments, the cylindrical shaped substrate can be formed using a flexible backing layer and wrapping the substrate around a cylindrical object, such as a glass or plastic rod or capillary.

In any of the disclosed process embodiments, the process can be a roll to roll process.

From the foregoing, it will be appreciated that various embodiments of the present disclosure have been described herein for purposes of illustration, and that various modifications can be made without departing from the scope and spirit of the present disclosure. Accordingly, the various embodiments disclosed herein are not intended to be limiting, with the true scope and spirit being indicated by the following claims.

EXAMPLES

Additional embodiments are disclosed in further detail in the following examples, which are not in any way intended to limit the scope of the claims.

Example 1

High Fidelity Nano-scale Patterns Transfer

Figure 10A:
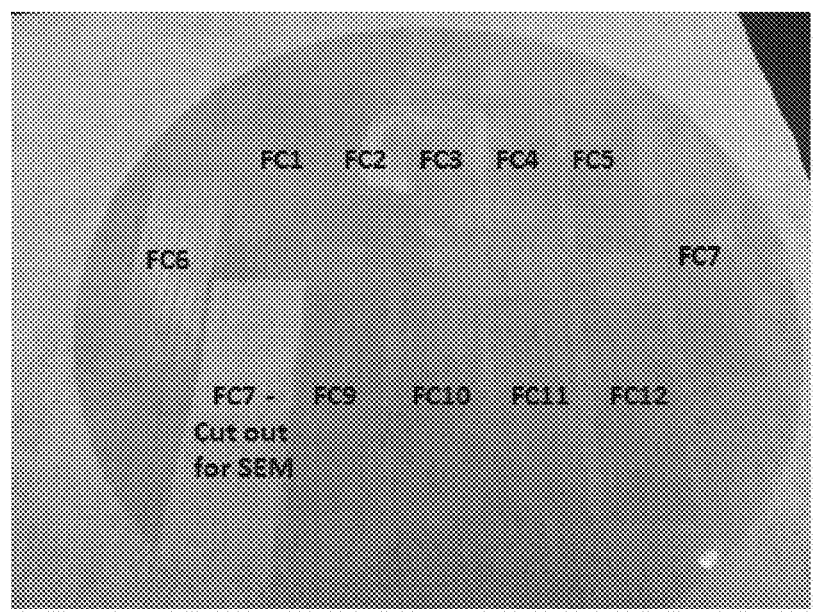
FIG. 10A is a top view of an 8 inch mater template wafer containing 12 Hi-seq sized patterned flowcells.

An 8" master template wafer containing 12 Hi-seq sized patterned flowcells was used to emboss directly into a UV curable adhesive coated polymer sheet (FIG. 10A). The template wafer with nano-scale patterned structures was aligned with a polymer sheet coated with a UV curable adhesive layer such that the adhesive layer was in direct contact with the nano patterned surface. Mechanical force was applied on the polymer sheet's non-adhesive surface. Then the polymer sheet was irradiated with UV light to cure the adhesive and the polymer sheet was released by delamination. As a result, high fidelity pattern transfer from the template to the polymer sheet was observed. Diffraction patterns from flowcell regions confirm large area pattern transfer.

Figure 10B:
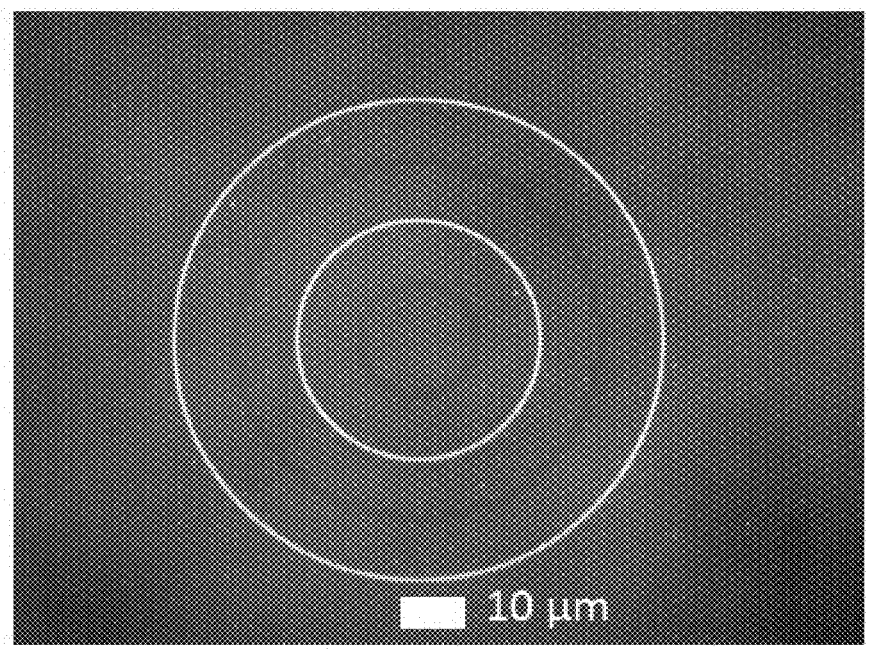
FIG. 10B is a top view dark field microscope image of the cut out Flowcell 7 from FIG. 10A.
Figure 10C:
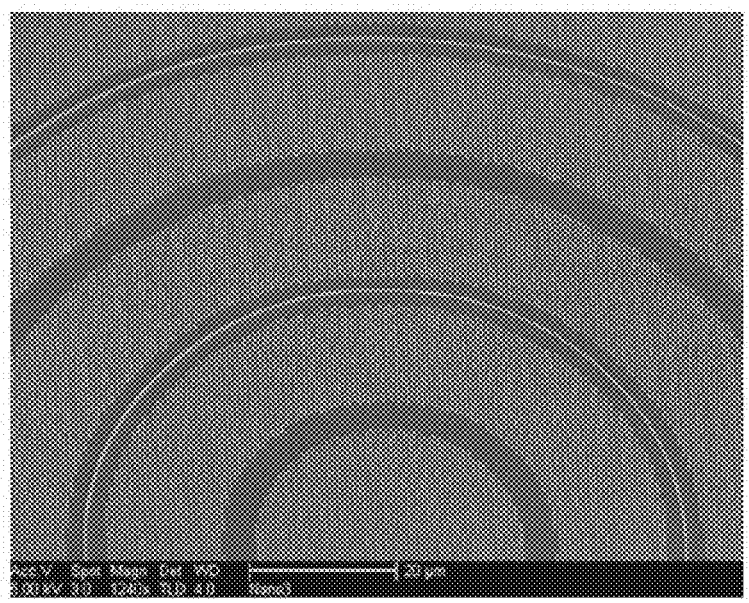
FIGS. 10C-10F are top view SEM images of the nano-scale patterns formed on a polymer sheet at 1240×, 20 k×, 40 k× and 80 k× magnification respectively.
Figure 10D:
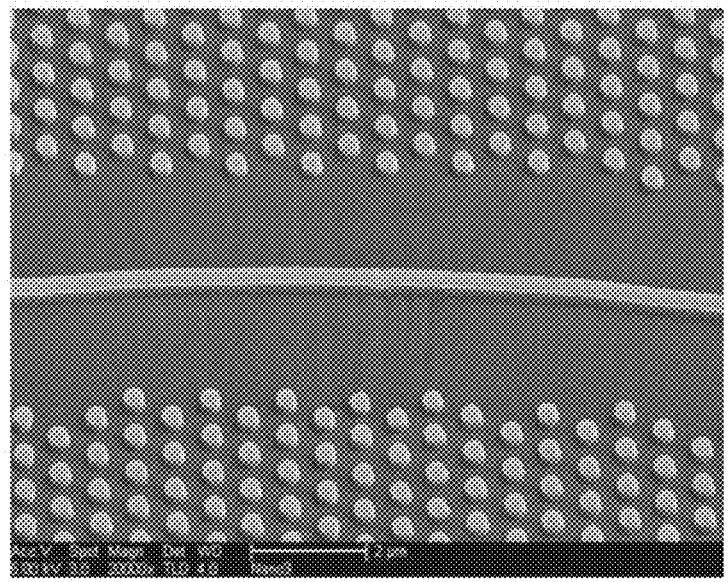
Figure 10E:
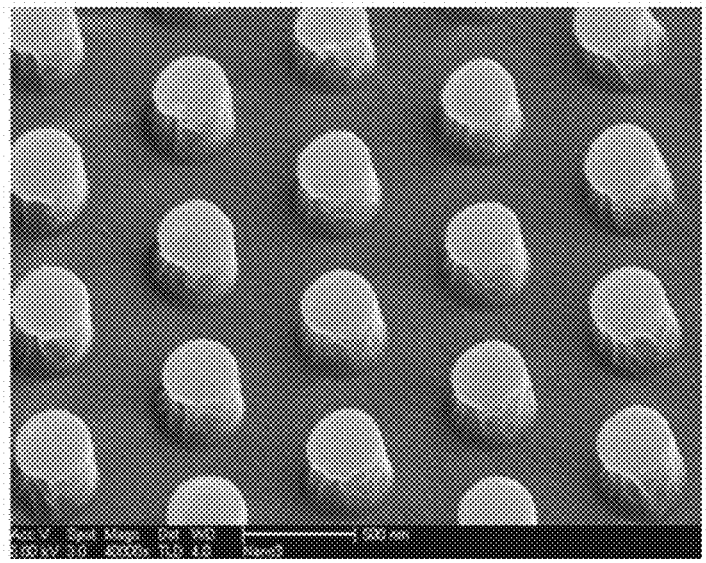
Figure 10F:
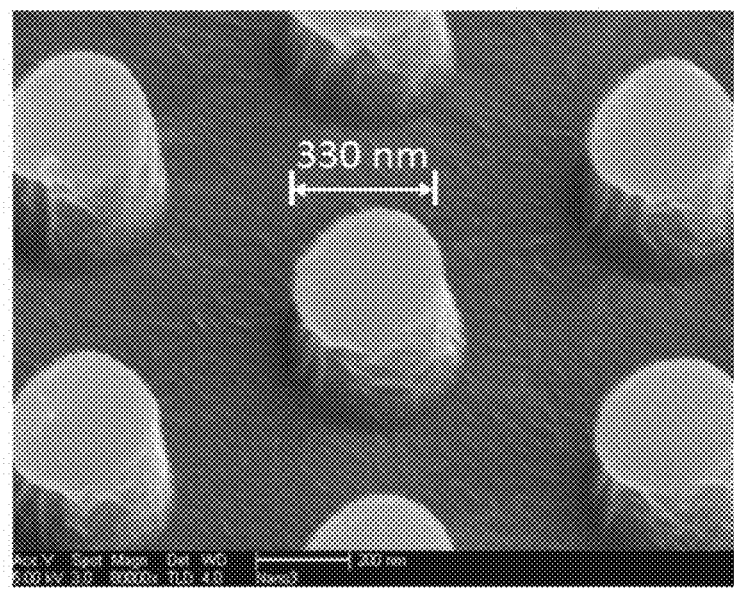

Flowcell 7 (FC7) was cut out of the polymer sheet for further microscope inspection and electron microscopy. As shown in FIG. 10B, dark field microscope image of a fiducial from FC7 confirms nano-scale patterns transfer. The master template in this case contained 350 nm nano-well features with 750 nm pitch. The pattern transferred into the polymer sheet was the opposite polarity as the pattern in the template (nano-posts). Furthermore, SEM images of fiducial region of the FC7 at 1240× and 20 k× magnifications are illustrated in FIGS. 10C and 10D. In addition, nano-scale pillars on polymer sheet at 40 k× and 80 k× magnifications are illustrated in FIGS. 10E and 10F. Excellent pattern transfer was seen in all cases with post diameters in the range of about 330 nm and a post-height of about 300 nm.

Example 2

High Fidelity Reverse Polarity Nano-Scale Patterns Transfer

Figure 11A:
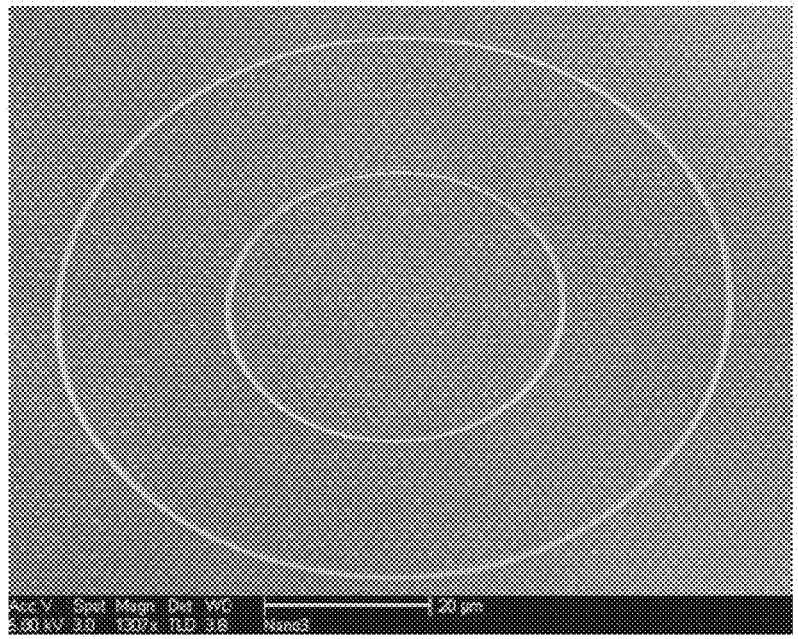
FIGS. 11A and 11B are top view SEM images of nano-scale patterns at 1307× and 5000× magnification respectively.
Figure 11B:
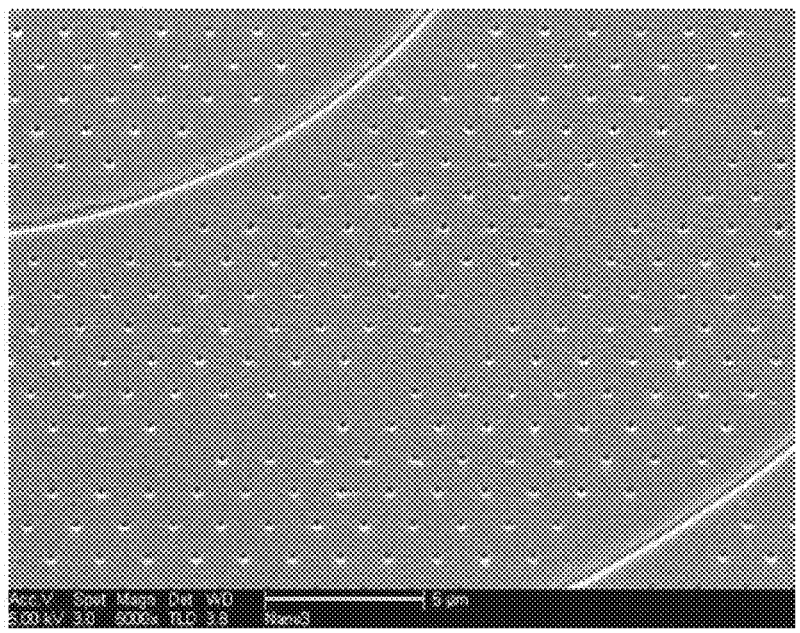

The polarity of nano-scale patterns of the master template was reversed as compared to the master template described in Example 1. The master template comprises nano-scale posts instead of nano-well features. The same pattern transfer process as described in Example 1 was used to generate the opposite polarity pattern on the polymer sheet. The formation of nano-wells and nano-trenches in the polymer sheet following physical embossing and UV curing are shown in FIGS. 11A and 11B with different magnification. High fidelity, high throughput pattern transfer was achieved.

Example 3

High Throughput Embossing of Microfluidic Structures

A silicon master template comprising microfluidic structures in patterned SU-8 photoresist was prepared. Then the silicon master wafer was imprinted into a clear polymer sheet with a UV curable adhesive layer such that the microfluidic pattern was in direct contact with the adhesive layer. After standard UV radiation and release process as described in Example 1, multiple 4-inch polymer replicas of the master wafer were formed in less than 2 minutes. The patterned microfluidic structures transferred are shown in FIGS. 12A-12D. These fluidic structures were formed in commercially available dicing tape (Lintec KL-3225 UV tape or Ultron Systems, Anti-Static UV Adhesive Plastic Film p/n: 1043R-9.05).

Figure 12A:
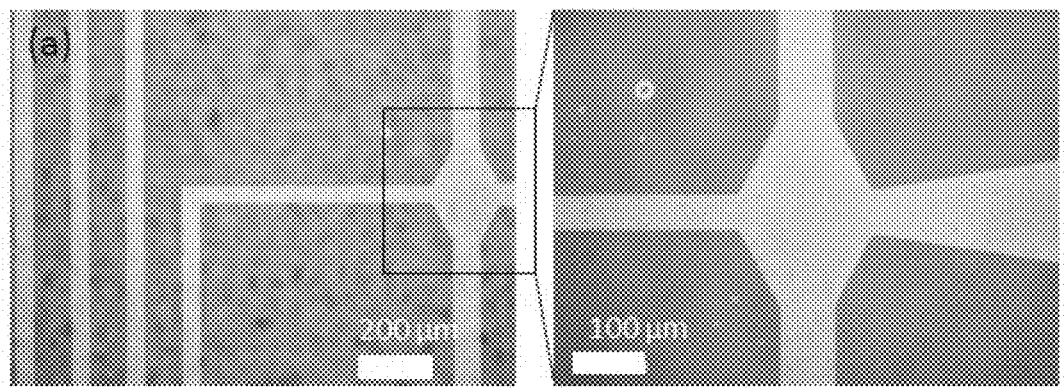
FIG. 12A is a top view optical image of serpentine microfluidic channels and junctions.
Figure 12B:
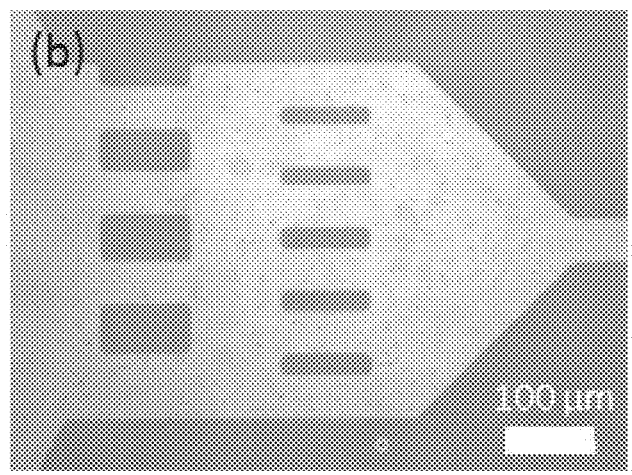
FIG. 12B is a top view of an optical image of a microfluidic filter.
Figure 12C:
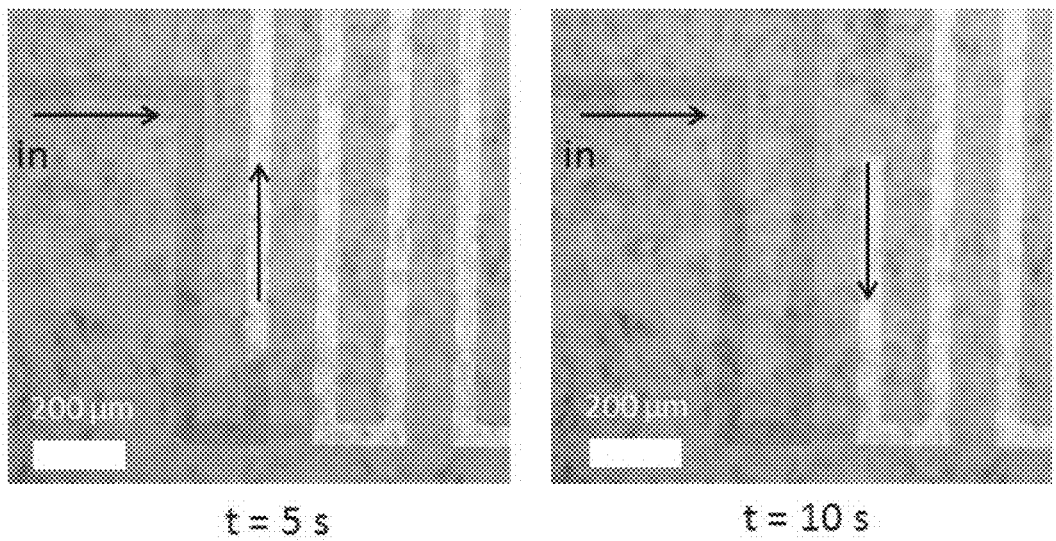
FIG. 12C is a top view of an optical image of a fluid flow through a serpentine microfluidic channels as a function of time.
Figure 12D:
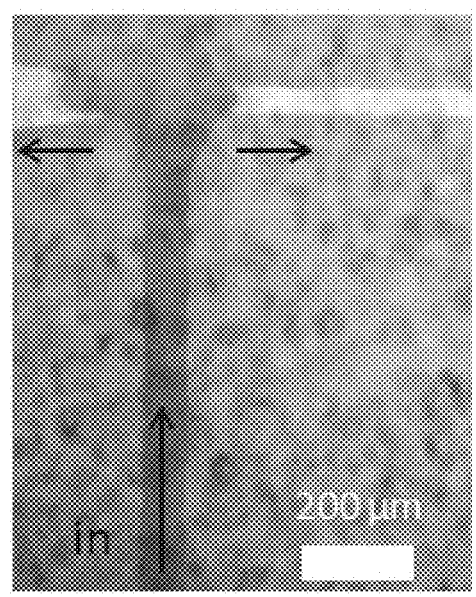
FIG. 12D is a top view of an optical image of a fluid flow into a T-junction.

FIG. 12A depicts serpentine fluidic channels and junctions formed for applications such as fluidic mixing. Similarly, Microfluidic filters (FIG. 12B) was formed for applications such as cell capture, separation or size dependent sorting. Furthermore, the microfluidic structures was tested by using capillary driven fluid (1M NaCl with red dye) flowing through a serpentine microfluidic channel. FIG. 12C illustrates an optical image of the fluid flowed through the microfluidic channel at different time point (t=5 s and t=10 s). FIG. 12D shows an optical image of the fluid flowed into a T-junction for fluid mixing.

What is claimed is:

1. A process of preparing a substrate, comprising:
   contacting a template having a plurality of micro-scale or nano-scale patterns with a surface of a substrate comprising a photocurable polymer layer disposed thereon;
   applying pressure to the template or substrate to transfer the plurality of micro-scale or nano-scale patterns to the photocurable polymer layer, wherein the contacting and applying are performed at room temperature;
   irradiating the photocurable polymer with UV light to cure the photocurable polymer to form a UV cured polymer layer; and
   separating the template from substrate;
   wherein the substrate comprises a functionalizable layer in contact with the photocurable polymer layer, wherein the functionalizable layer comprises a functionalizable hydrogel or a functionalizable polymer, and wherein the functionalizable hydrogel or functionalizable polymer comprises one or more functional groups capable of attaching to biomolecules; and
   wherein the one or more functional groups of the functionalizable hydrogel or the functionalizable polymer are selected from the group consisting of optionally substituted alkene, azide, optionally substituted amine, carboxylic acid, optionally substituted hydrazone, hydroxy, optionally substituted tetrazole, optionally substituted tetrazine, thiol, and combinations thereof.

2. The process of claim 1, wherein at least a portion of the micro-scale or nano-scale patterns of the template are transferred to the functionalizable layer.

3. The process of claim 1, further comprising applying a sealing layer to the substrate after removing the template to substantially seal the UV cured polymer layer and the functionalizable layer.

4. The process of claim 1, wherein at least a portion of the micro-scale or nano-scale patterns are posts having an average diameter or an average height of less than about 500 nm.

5. The process of claim 1, wherein the functionalizable polymer or the functionalizable hydrogel comprising Formula (Ia):

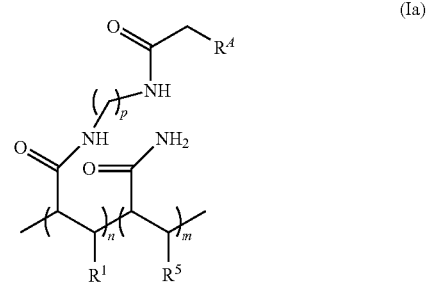

R$^1$ is H or optionally substituted alkyl;
R$^4$ is azide, optionally substituted amine, optionally substituted alkene, optionally substituted hydrazone, carboxylic acid, halogen, hydroxy, optionally substituted tetrazole, optionally substituted tetrazine, or thiol;
R$^5$ is H or optionally substituted alkyl;
each of the —(CH$_2$)-p is optionally substituted;
p is an integer in the range of 1 to 50;
n is an integer in the range of 1 to 50,000; and
m is an integer in the range of 1 to 100,000.

6. The process of claim 1, wherein functionalizable hydrogel or the functionalizable polymer comprises poly(N-(5-azidoacetamidylpentyl) acrylamide-co-acrylamide) (PAZAM).

7. The process of claim 1, wherein the functionalizable layer further comprises biomolecules covalently attached thereto, and wherein the biomolecules comprise amino acids, nucleosides, nucleotides, peptides, oligonucleotides, polynucleotides, nucleic acids, or proteins, or combinations thereof.

8. The process of claim 7, wherein the biomolecules comprise oligonucleotides, polynucleotides, or nucleic acids, or combinations thereof.

9. The process of claim 1, wherein the photocurable polymer comprises urethane, acrylate, silicone, epoxy, polyacrylic acid, polyacrylates, epoxy silicone, epoxy resins, polydimethylsiloxane (PDMS), silsesquioxane, acyloxysilanes, maleate polyesters, vinyl ethers, monomers with vinyl or ethynyl groups, or copolymers or combinations thereof.

10. The process of claim 1, wherein at least one of the polymer layer or functionalizable layer comprises a dopant material selected from the group consisting of nanoparticles, Q dots, binding receptors, ligands, nucleic acids, reactive moieties in the functionalizable layer, optical filter materials, lighter absorbing materials, light emitting materials, light scattering materials, electrical conductive materials and thermally conductive materials, and combinations thereof.

11. The process of claim 1, wherein the process is a roll to roll process.

12. A process of preparing a substrate, comprising:
depositing a functionalizable layer comprising one or more functional groups onto a surface of a template comprising a plurality of micro-scale or nano-scale patterns, such that the functionalizable layer is contained inside at least a portion of said micro-scale or nano-scale patterns;
contacting the surface of the template comprising the plurality of micro-scale or nano-scale patterns with a surface of a substrate comprising a photocurable polymer layer disposed thereon;
applying pressure to the template or substrate to transfer said micro-scale or nano-scale patterns to the photocurable polymer layer, wherein the contacting and applying are performed at room temperature;
irradiating the photocurable polymer with UV light to form a UV cured polymer layer; and; and
separating the template from the substrate;
wherein at least a portion of the functionalizable layer is transferred onto the UV cured polymer layer, wherein the functionalizable layer comprises a functionalizable hydrogel or a functionalizable polymer, and wherein the functionalizable hydrogel or functionalizable polymer comprises one or more functional groups capable of attaching to biomolecules; and
wherein the one or more functional groups of the functionalizable hydrogel or the functionalizable polymer are selected from the group consisting of optionally substituted alkene, azide, optionally substituted amine, carboxylic acid, optionally substituted hydrazone, hydroxy, optionally substituted tetrazole, optionally substituted tetrazine, thiol, and combinations thereof.

13. The process of claim 12, wherein the functionalizable polymer or the functionalizable hydrogel comprising Formula (Ia):

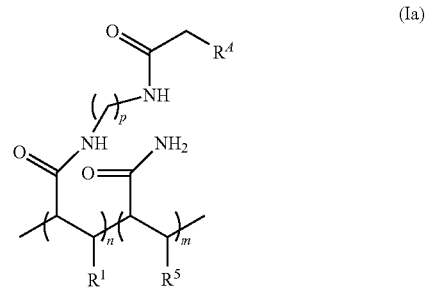

$R^1$ is H or optionally substituted alkyl;
$R^4$ is azide, optionally substituted amine, optionally substituted alkene, optionally substituted hydrazone, carboxylic acid, halogen, hydroxy, optionally substituted tetrazole, optionally substituted tetrazine, and thiol;
$R^5$ is H or optionally substituted alkyl;
each of the —(CH$_2$)-p is optionally substituted;
p is an integer in the range of 1 to 50;
n is an integer in the range of 1 to 50,000; and
m is an integer in the range of 1 to 100,000.

14. The process of claim 12, wherein functionalizable hydrogel or the functionalizable polymer comprises poly(N-(5-azidoacetamidylpentyl) acrylamide-co-acrylamide) (PAZAM).

15. The process of claim 12, wherein the functionalizable layer further comprises biomolecules covalently attached thereto, and wherein the biomolecules comprise amino acids, nucleosides, nucleotides, peptides, oligonucleotides, polynucleotides, nucleic acids, or proteins, or combinations thereof.

16. The process of claim 15, wherein the biomolecules comprise oligonucleotides, polynucleotides, or nucleic acids, or combinations thereof.

17. The process of claim 12, wherein the photocurable polymer comprises urethane, acrylate, silicone, epoxy, polyacrylic acid, polyacrylates, epoxy silicone, epoxy resins, polydimethylsiloxane (PDMS), silsesquioxane, acyloxysilanes, maleate polyesters, vinyl ethers, monomers with vinyl or ethynyl groups, or copolymers or combinations thereof.

* * * * *

UNITED STATES PATENT AND TRADEMARK OFFICE
CERTIFICATE OF CORRECTION

PATENT NO. : 11,110,683 B2  
APPLICATION NO. : 16/880809  
DATED : September 7, 2021  
INVENTOR(S) : Bowen Page 1 of 1

It is certified that error appears in the above-identified patent and that said Letters Patent is hereby corrected as shown below:

In the Specification

Column 8, Line 54, delete "isoquinlinyl," and insert --isoquinolinyl,--.

Column 18, Line 50, delete "aresnide," and insert --arsenide,--.

In the Claims

Column 25, Claim 9, Line 6, delete "epoxy silicone," and insert --epoxysilicone,--.

Column 25, Claim 12, Line 36, delete "and; and" and insert --and--.

Column 26, Claim 17, Line 45, delete "epoxy silicone," and insert --epoxysilicone,--.

Signed and Sealed this  
Eleventh Day of January, 2022

Drew Hirshfeld  
*Performing the Functions and Duties of the  
Under Secretary of Commerce for Intellectual Property and  
Director of the United States Patent and Trademark Office*